United States Patent
Yun

(10) Patent No.: US 10,804,292 B2
(45) Date of Patent: Oct. 13, 2020

(54) VERTICAL MEMORY DEVICES AND METHODS OF MANUFACTURING THE SAME

(71) Applicant: Samsung Electronics Co., Ltd., Suwon-si (KR)

(72) Inventor: Jang-Gn Yun, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/437,208

(22) Filed: Jun. 11, 2019

(65) Prior Publication Data
US 2020/0135757 A1 Apr. 30, 2020

(30) Foreign Application Priority Data
Oct. 29, 2018 (KR) .................... 10-2018-0129667

(51) Int. Cl.
| | | |
|---|---|---|
| H01L 27/11582 | (2017.01) | |
| H01L 23/528 | (2006.01) | |
| H01L 27/11565 | (2017.01) | |
| H01L 21/311 | (2006.01) | |
| H01L 21/02 | (2006.01) | |
| H01L 21/28 | (2006.01) | |

(52) U.S. Cl.
CPC ...... *H01L 27/11582* (2013.01); *H01L 23/528* (2013.01); *H01L 27/11565* (2013.01); *H01L 21/02164* (2013.01); *H01L 21/02532* (2013.01); *H01L 21/02592* (2013.01); *H01L 21/31111* (2013.01); *H01L 29/40117* (2019.08)

(58) Field of Classification Search
CPC ............ H01L 23/528; H01L 27/11582; H01L 27/11565; H01L 29/40117; H01L 21/02592; H01L 21/02164; H01L 21/31111; H01L 21/02532
USPC ......................................... 257/324, 326, 328
See application file for complete search history.

(56) References Cited

U.S. PATENT DOCUMENTS

| | | |
|---|---|---|
| 8,786,003 B2 | 7/2014 | Iwase et al. |
| 9,449,987 B1 | 9/2016 | Miyata et al. |
| 9,716,104 B2 | 7/2017 | Kim et al. |
| 9,786,683 B1 | 10/2017 | Sakuma et al. |
| 9,929,166 B1 | 3/2018 | Sakuma et al. |

(Continued)

*Primary Examiner* — Thinh T Nguyen
(74) *Attorney, Agent, or Firm* — Muir Patent Law, PLLC

(57) ABSTRACT

A vertical memory device includes conductive lines on a substrate, first and second semiconductor patterns, first and second pads, first and second electrodes, a third electrode, and a first division pattern. The conductive lines are stacked in a vertical direction and extend in a first direction. The first and second semiconductor patterns extend through the conductive lines in the vertical direction. The first and second pads are formed on the first and second semiconductor patterns. The first and second electrodes are electrically connected to the first and second pads. The third electrode is electrically connected to a first conductive line of the conductive lines. The first division pattern extends in a second direction, and extends through and divides the first conductive line. In a plan view, the first and second semiconductor patterns and the first conductive line are disposed at one side of the first division pattern.

20 Claims, 38 Drawing Sheets

(56) References Cited

U.S. PATENT DOCUMENTS

2009/0242967 A1* 10/2009 Katsumata et al. ........................ H01L 27/11551
257/324
2012/0032250 A1  2/2012  Son et al.
2016/0268304 A1  9/2016  Ikeda et al.

* cited by examiner

FIG. 1
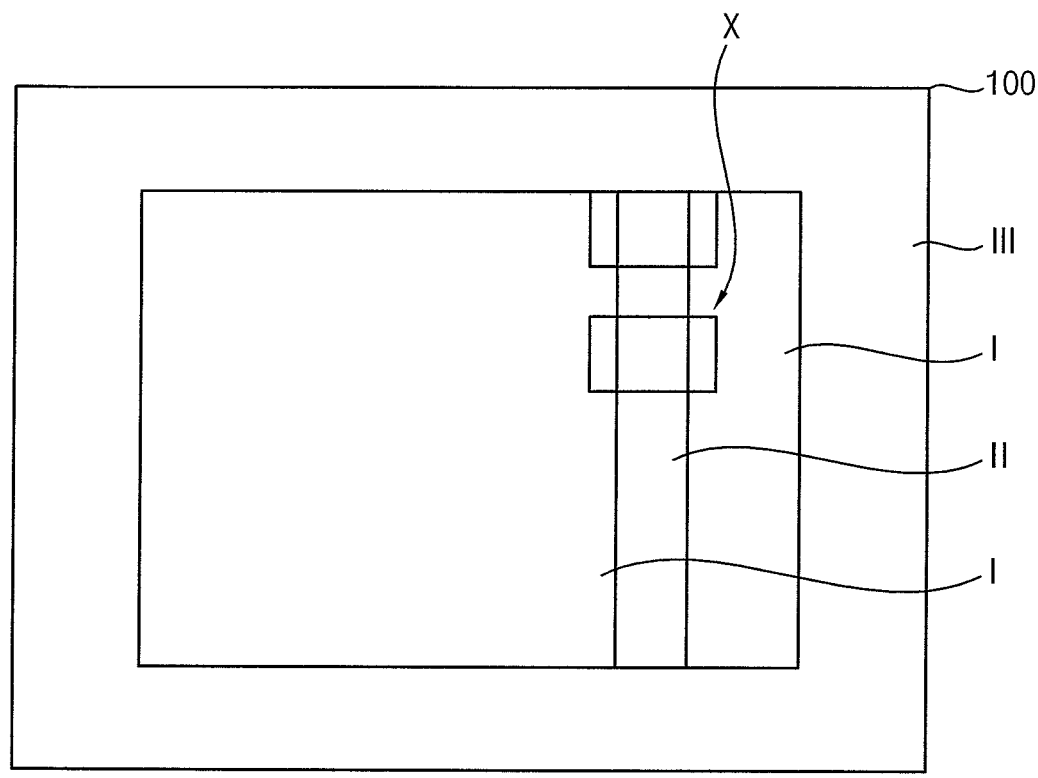
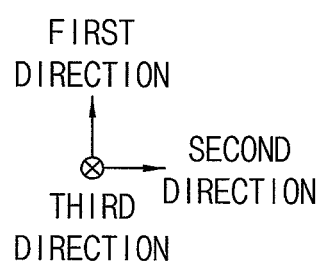

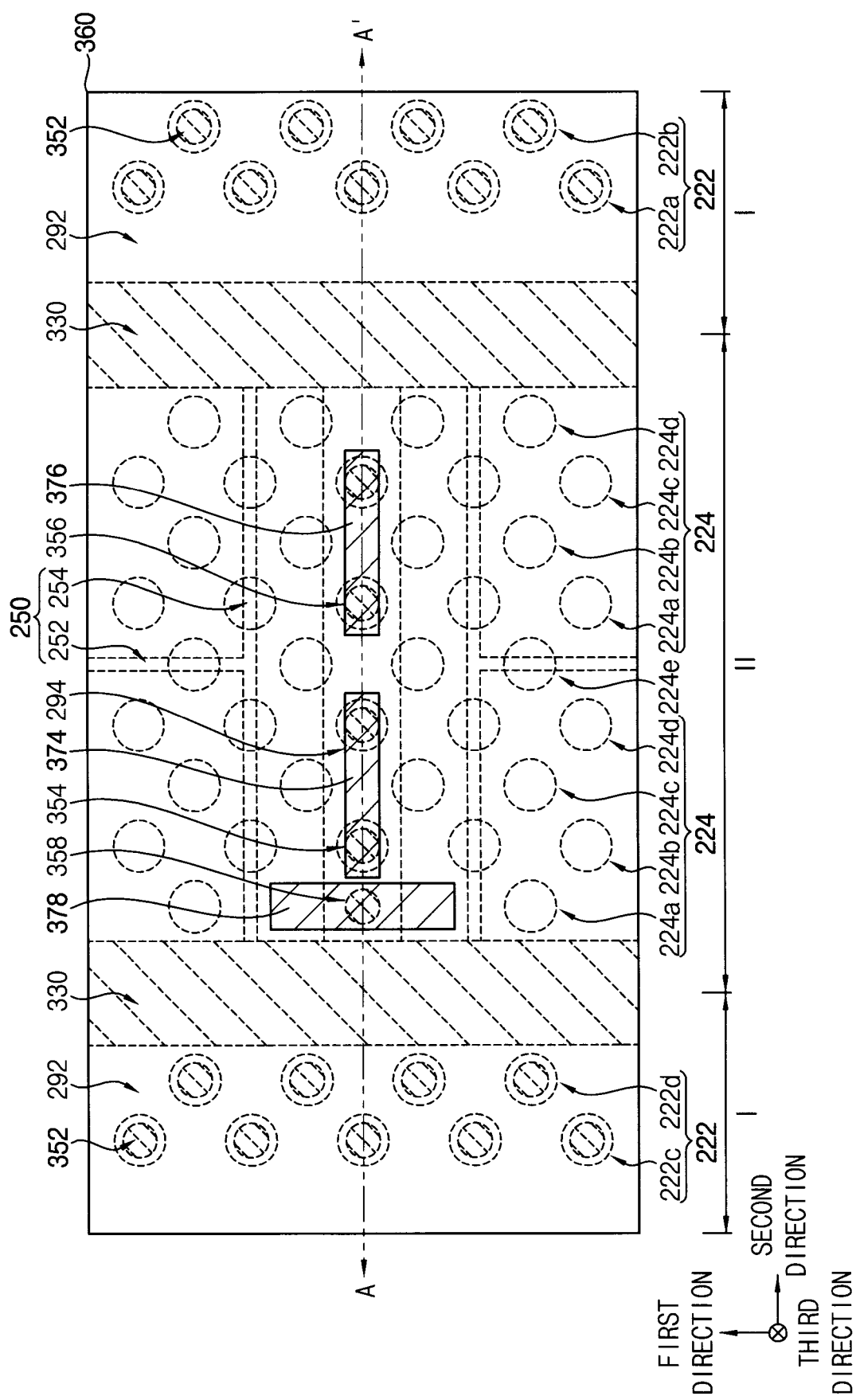

VERTICAL MEMORY DEVICES AND METHODS OF MANUFACTURING THE SAME

CROSS-REFERENCE TO RELATED APPLICATIONS

This application claims priority under 35 U.S.C. § 119 to Korean Patent Application No. 10-2018-0129667, filed on Oct. 29, 2018, in the Korean Intellectual Property Office (KIPO), the contents of which are herein incorporated by reference in their entirety.

BACKGROUND

1. Field

The inventive concepts relate to vertical memory devices and methods of manufacturing the same.

2. Description of the Related Art

In order to increase the integration degree of a VNAND flash memory device, the number of levels at which gate electrodes are stacked on a substrate increases and the area of a cell region in which memory cells are formed decreases. However, in order to increase the integration degree, it is also useful to decrease the area of a circuit region in which circuit patterns for driving the memory cells are formed.

SUMMARY

Example embodiments provide a vertical memory device having good characteristics.

Example embodiments provide a method of manufacturing a vertical memory device having good characteristics.

According to some example embodiments, the disclosure is directed to a vertical memory device, comprising: conductive lines stacked on a substrate, the conductive lines being spaced apart from each other in a vertical direction perpendicular to an upper surface of the substrate, and each of the conductive lines extending lengthwise in a first direction parallel to the upper surface of the substrate; first and second semiconductor patterns extending through the conductive lines in the vertical direction; first and second pads on the first and second semiconductor patterns, respectively; first and second electrodes electrically connected to the first and second pads, respectively; a third electrode electrically connected to a first conductive line of the conductive lines; and a first division pattern extending lengthwise in a second direction parallel to the upper surface of the substrate and crossing the first direction, the first division pattern extending through and dividing the first conductive line, wherein in a plan view, the first and second semiconductor patterns and the first conductive line are disposed at one side of the first division pattern.

According to some example embodiments, the disclosure is directed to a vertical memory device, comprising: conductive lines stacked on a substrate, the conductive lines being spaced apart from each other in a vertical direction perpendicular to an upper surface of the substrate, and each of the conductive lines extending lengthwise in a first direction parallel to the upper surface of the substrate; semiconductor patterns extending through the conductive lines in the vertical direction; conductive pads on the semiconductor patterns, respectively; source and drain electrodes electrically connected to first and second pads, respectively, of the conductive pads; a gate electrode electrically connected to a first conductive line of the conductive lines; and a pair of first division patterns, each of the pair of first division patterns extending lengthwise in a second direction and dividing the first conductive line, the second direction being parallel to the upper surface of the substrate and crossing the first direction, wherein first and second semiconductor patterns under the first and second pads, respectively, among the semiconductor patterns are connected with each other, and wherein in a plan view, the first and second pads, the first and second semiconductor patterns, and the first conductive line are disposed between the pair of first division patterns to form a transistor.

According to some example embodiments, the disclosure is directed to a vertical memory device, comprising: conductive lines stacked on a substrate in a vertical direction perpendicular to an upper surface of the substrate, the substrate including first and second regions; channels extending through the conductive lines in the vertical direction; conductive pads on the channels, respectively, the conductive pads including first pads on the first region of the substrate and second and third pads on the second region of the substrate; a first wiring for applying a first signal to the first pads on the first region of the substrate; second and third wirings for applying second and third signals to the second and third pads, respectively, on the second region of the substrate, the second and third wirings being different from the first wiring; and a fourth wiring for applying a fourth signal to a portion of one conductive line among the conductive lines on the second region of the substrate, wherein the second and third pads, the channels under the second and third pads, respectively, and the portion of one conductive line form a transistor.

According to some example embodiments, the disclosure is directed to a vertical memory device, comprising: circuit patterns on a substrate; an insulating interlayer covering the circuit patterns; a base pattern on the insulating interlayer; conductive lines stacked on the base pattern in a vertical direction perpendicular to an upper surface of the substrate; first and second semiconductor patterns extending through the conductive lines in the vertical direction; a third semiconductor pattern commonly contacting lower surfaces of the first and second semiconductor patterns to connect the first and second semiconductor patterns with each other; first and second pads on the first and second semiconductor patterns, respectively; first and second electrodes electrically connected to the first and second pads, respectively; and a third electrode electrically connected to a first conductive line among the conductive lines, wherein the first to third semiconductor patterns, the first and second pads, and the first conductive line form a transistor.

According to some example embodiments, the disclosure is directed to a vertical memory device, comprising: circuit patterns on a substrate including first and second regions; an insulating interlayer covering the circuit patterns; a base pattern on the insulating interlayer; conductive lines stacked on the base pattern in a vertical direction perpendicular to an upper surface of the substrate; channels extending through the conductive lines in the vertical direction; conductive pads on the channels, respectively, the conductive pads including first pads on the first region of the substrate and second and third pads on the second region of the substrate; a first wiring for applying a first signal to the first pads on the first region of the substrate; second and third wirings for applying second and third signals to the second and third pads, respectively, on the second region of the substrate, the second and third wirings being different from the first wiring; and a fourth wiring for applying a fourth signal to one conductive line among the conductive lines on the second region of the substrate, wherein the second and third pads, the channels thereunder, and the one conductive line form a transistor.

According to some example embodiments, the disclosure is directed to a method of manufacturing a vertical memory device, the method comprising: alternately and repeatedly stacking an insulation layer and a first sacrificial layer on a substrate in a vertical direction perpendicular to an upper surface of the substrate to form a mold; forming first and second semiconductor patterns through the mold to extend in the vertical direction; forming first and second pads on the first and second semiconductor patterns, respectively; forming a pair of first division patterns extending through and dividing at least an uppermost one of the first sacrificial layers, each first division pattern of the pair of first division patterns extending in a first direction parallel to the upper surface of the substrate, and the first and second semiconductor patterns being disposed between the pair of first division patterns in a plan view; forming an opening through the mold to extend in a second direction parallel to the upper surface of the substrate and crossing the first direction; replacing the first sacrificial layers exposed by the opening with conductive lines; forming first and second electrodes on the first and second pads, respectively; and forming a third electrode at a portion of a first conductive line at an uppermost level among the conductive lines, the portion of the first conductive line being between the pair of first division patterns.

According to some example embodiments, the disclosure is directed to a method of manufacturing a vertical memory device, the method comprising: alternately and repeatedly stacking an insulation layer and a sacrificial layer on a substrate in a vertical direction perpendicular to an upper surface of the substrate to form a mold, the substrate including first and second regions; forming channels through the mold to extend in the vertical direction; forming conductive pads on the channels, respectively, the conductive pads including first pads on the first region of the substrate and second and third pads on the second region of the substrate; forming an opening through the mold to expose the upper surface of the substrate, the opening extending in a first direction parallel to the upper surface of the substrate; replacing the sacrificial layers exposed by the opening with conductive lines, respectively; forming a first wiring to be electrically connected to the first pads on the first region of the substrate; forming second and third wirings to be electrically connected to the second and third pads, respectively, on the second region of the substrate; and forming a fourth wiring to be electrically connected to an uppermost one among the conductive lines on the second region of the substrate.

According to some example embodiments, the disclosure is directed to a method of manufacturing a vertical memory device, the method comprising: forming an insulating interlayer covering circuit patterns on a substrate; forming a base pattern on the insulating interlayer; forming a first sacrificial layer on the base pattern; alternately and repeatedly stacking an insulation layer and a second sacrificial layer on the first sacrificial layer in a vertical direction perpendicular to an upper surface of the substrate to form a mold; forming first and second semiconductor patterns through the mold and the first sacrificial layer to extend in the vertical direction; forming first and second pads on the first and second semiconductor patterns, respectively; forming an opening through the mold and the first sacrificial layer to expose the upper surface of the substrate, the opening extending lengthwise in a first direction parallel to the upper surface of the substrate; replacing the first sacrificial layer exposed by the opening with a third semiconductor pattern; replacing the second sacrificial layer exposed by the opening with conductive lines, respectively; forming first and second electrodes to be electrically connected to the first and second pads, respectively; and forming a third electrode to be electrically connected to a first conductive line at an uppermost level among the conductive lines.

In the vertical memory device in accordance with example embodiments, some memory cell structures may be used as circuit patterns for driving the memory cells, and thus the area of a circuit region in which the circuit patterns may be formed may be reduced to increase the integration degree.

BRIEF DESCRIPTION OF THE DRAWINGS

FIGS. 1 to 18, 19A, and 19B are plan views and cross-sectional views illustrating a method of manufacturing a vertical memory device in accordance with example embodiments;

DETAILED DESCRIPTION

The above and other aspects and features of the vertical memory devices and the methods of manufacturing the same in accordance with example embodiments will become readily understood from detail descriptions that follow, with reference to the accompanying drawings.

FIGS. 1 to 18, 19A, and 19B are plan views and cross-sectional views illustrating a method of manufacturing a vertical memory device in accordance with example embodiments. Specifically, FIGS. 1-2, 4, 8, 11, 16 and 18 are the plan views, and FIGS. 3, 5-7, 9-10, 12-15, 17 and 19A and 19B are the cross-sectional views.

Figure 5:
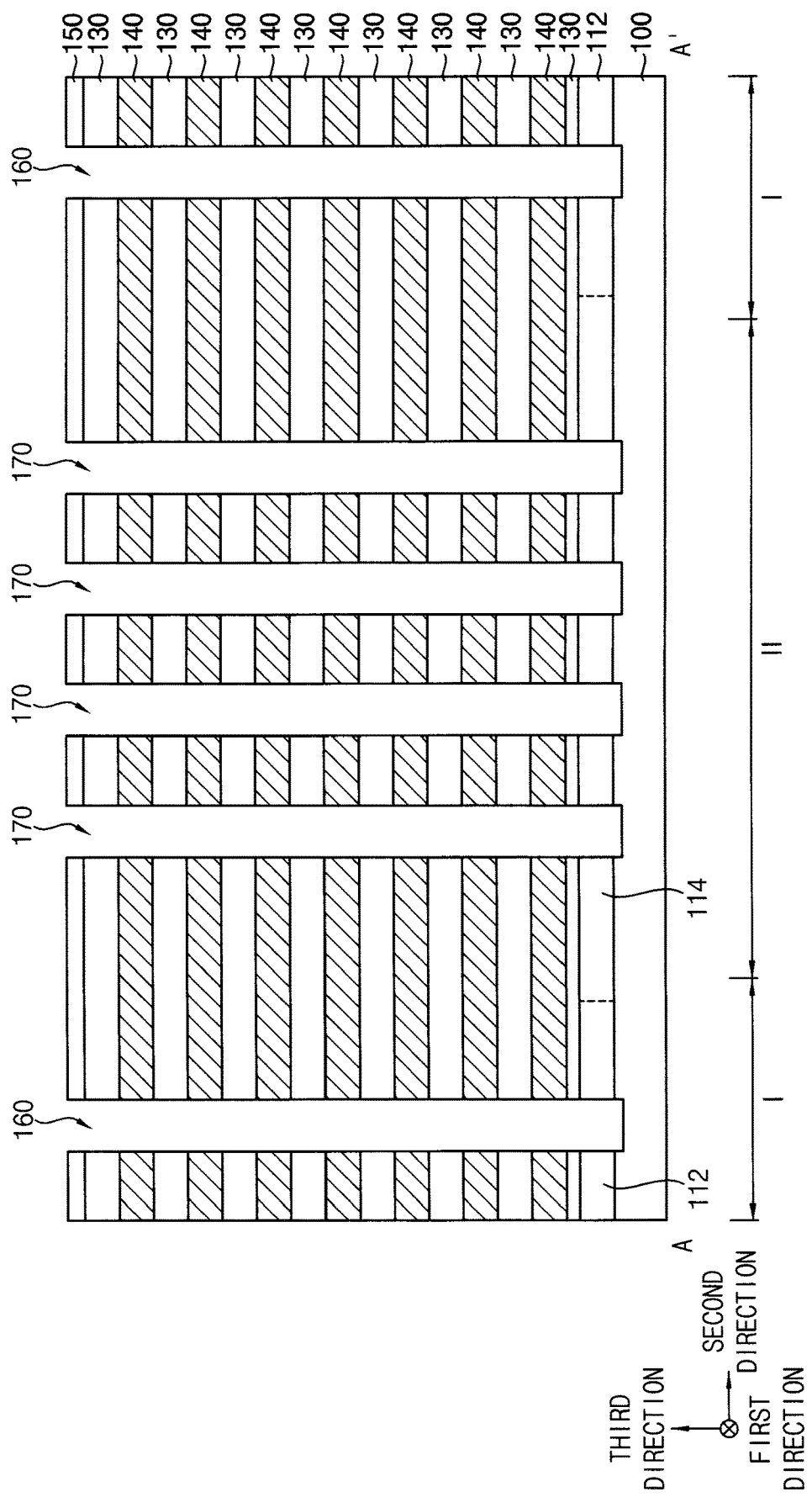
Figure 6:
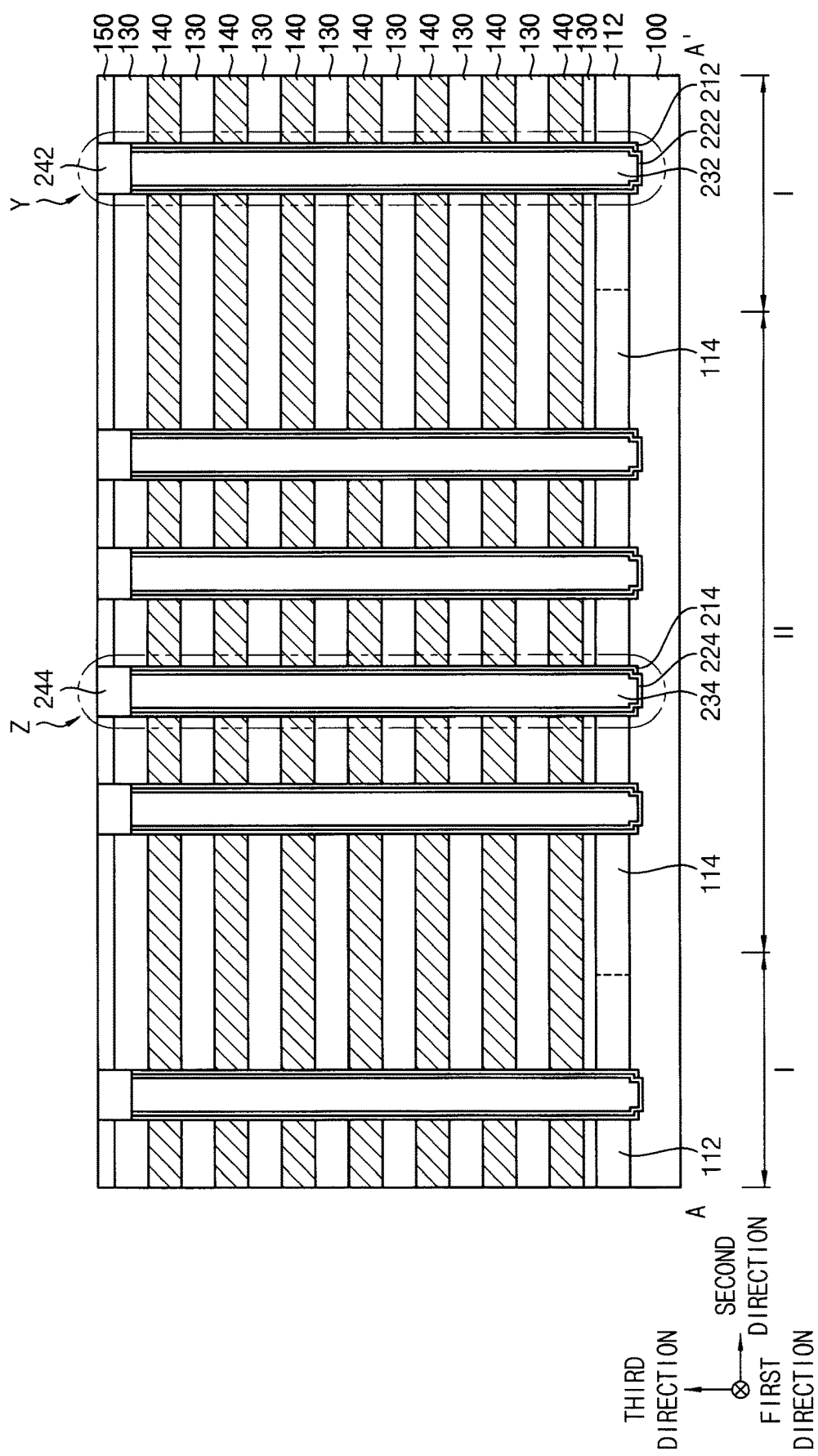
Figure 7:
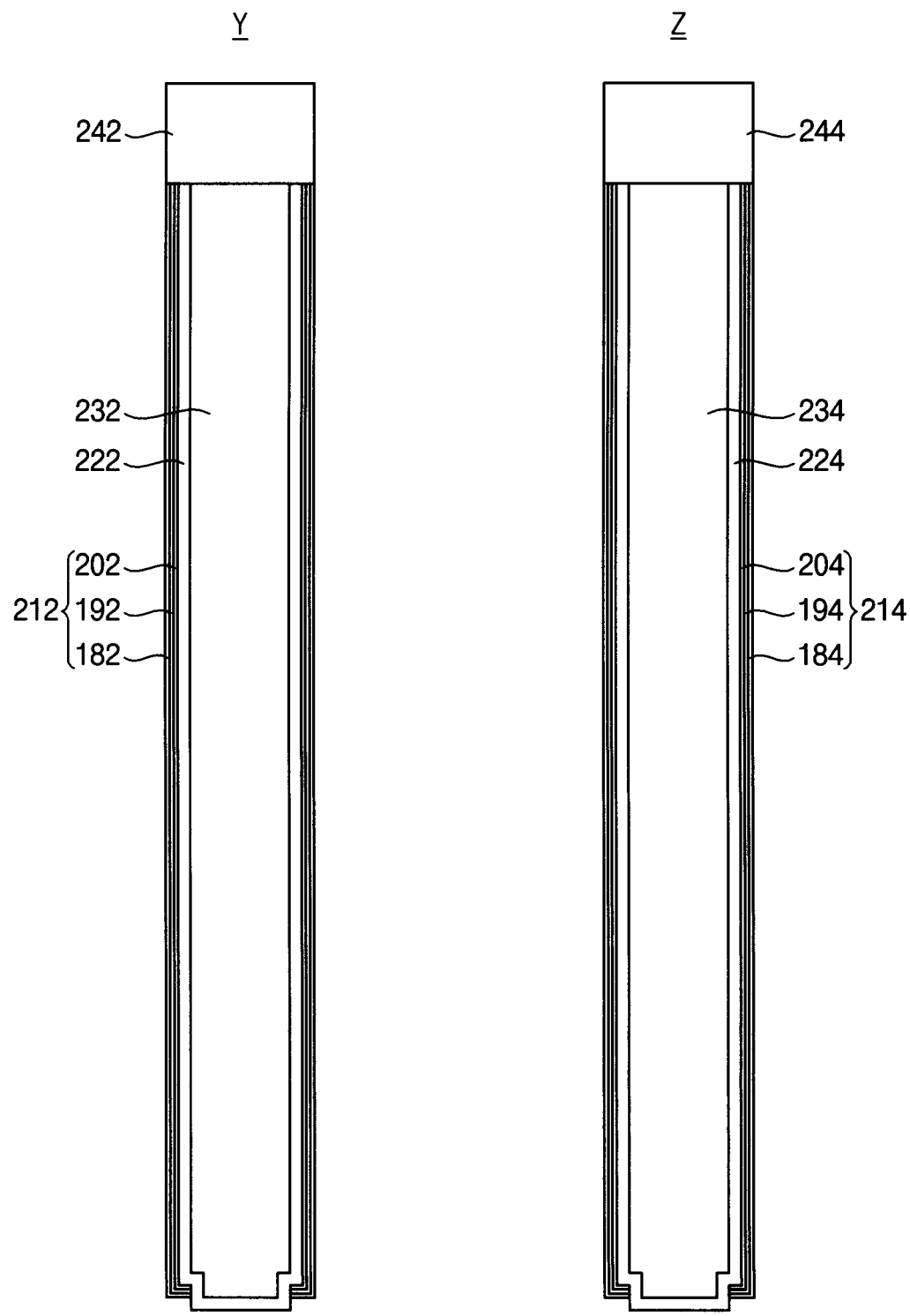
Figure 8:
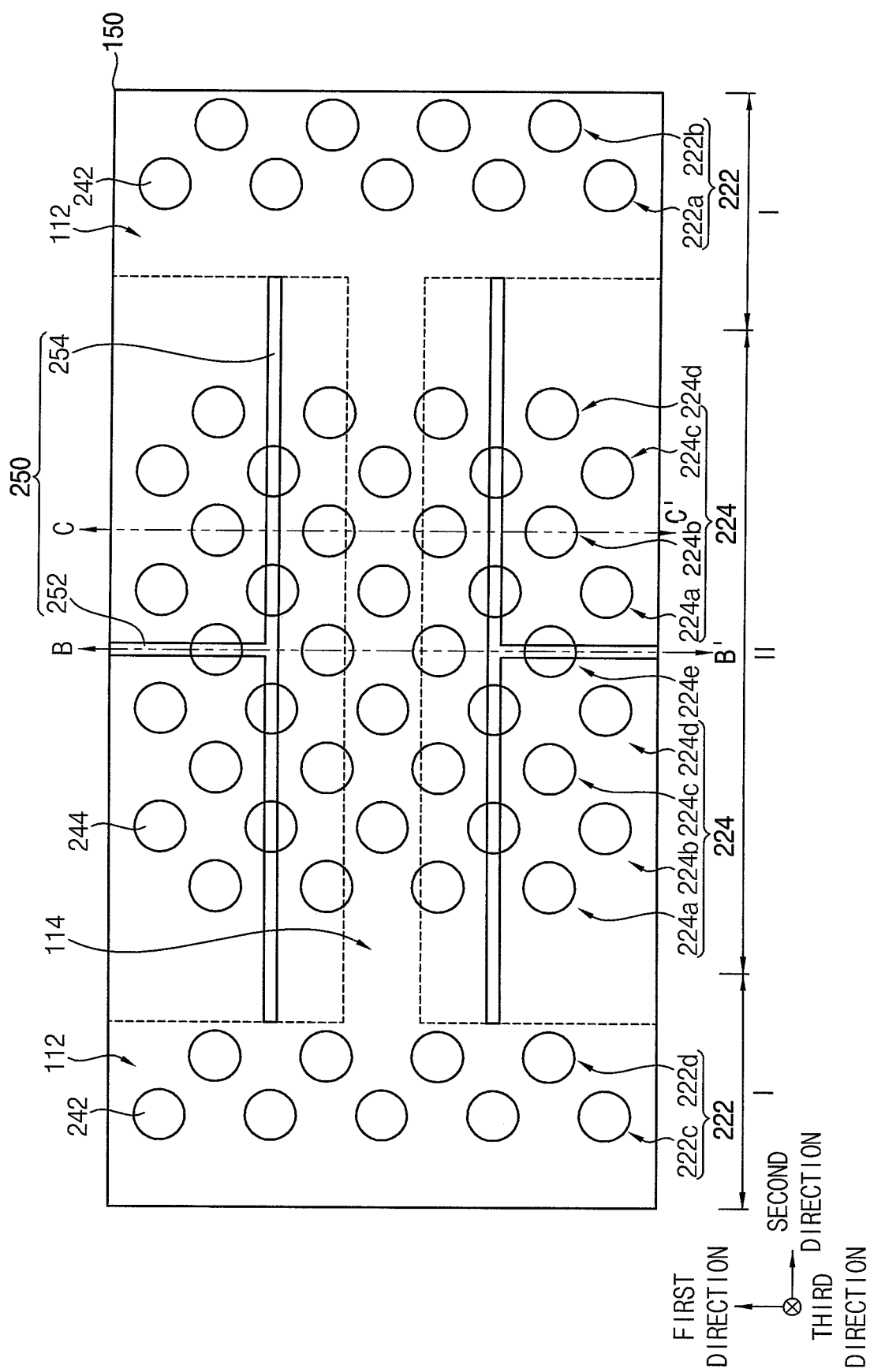
Figure 9:
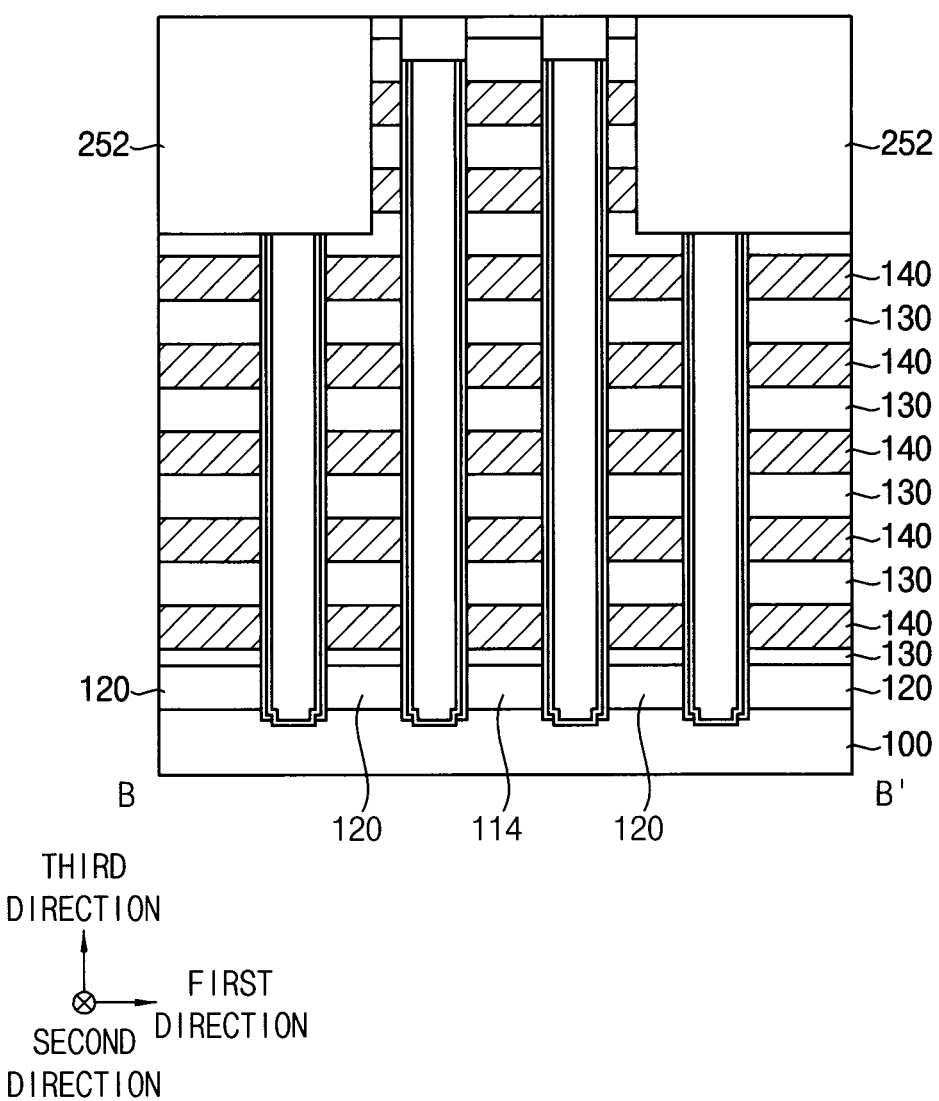
Figure 10:
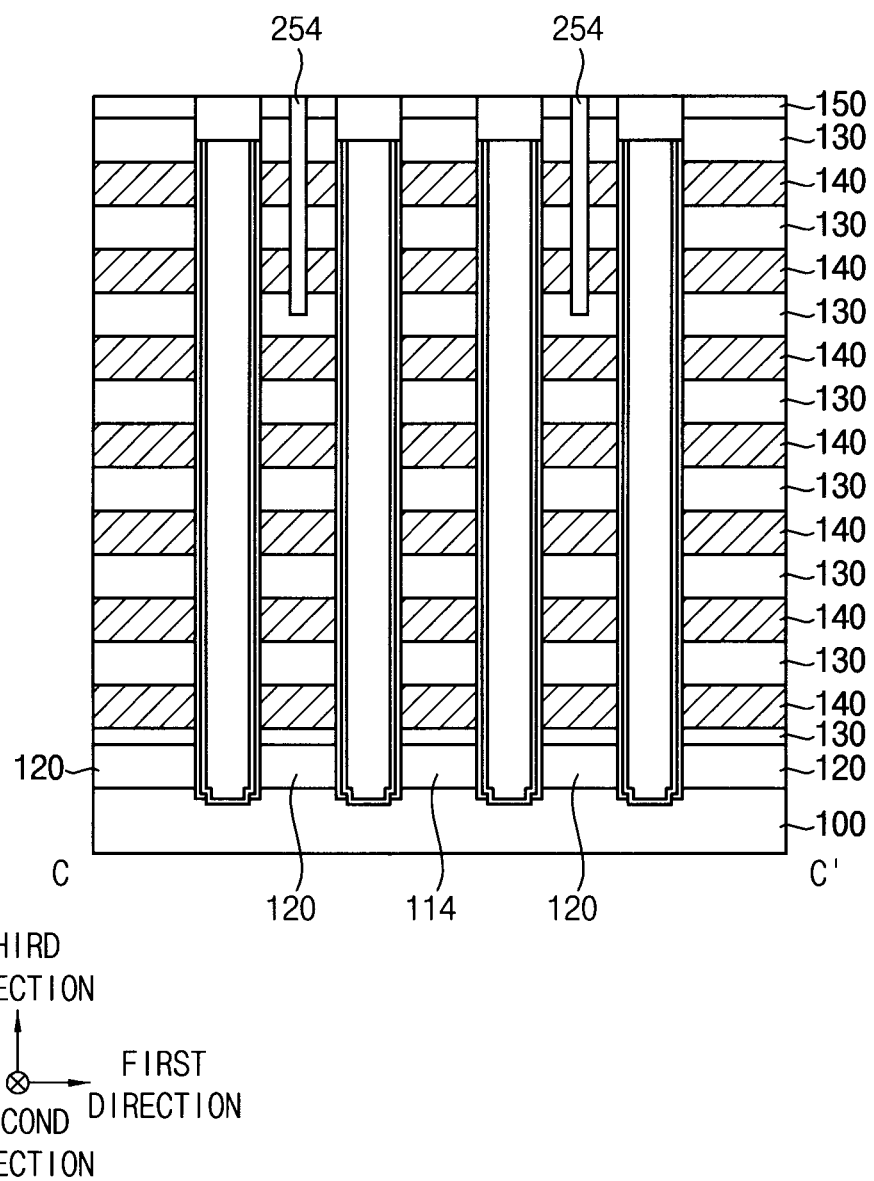

Specifically, FIGS. 3, 5-7, 12-15, 17 and 19A-19B are cross-sectional views taken along lines A-A', respectively, of corresponding plan views, FIG. 9 is a cross-sectional view taken along a line B-B' of a corresponding plan view, and FIG. 10 is a cross-sectional view taken along a line C-C' of a corresponding plan view. FIG. 7 is an enlarged cross-sectional view of a region Y and a region Z of FIG. 6, and FIGS. 2 to 18 and 19A-19B are drawings of a region X of FIG. 1.

Hereinafter, two directions substantially parallel to an upper surface of a substrate and crossing each other may be defined as first and second directions, respectively, and a direction substantially perpendicular to the upper surface of the substrate may be defined as a third direction. In example embodiments, the first and second directions may be substantially perpendicular to each other.

Referring to FIG. 1, a substrate 100 may include first, second and third regions I, II and III.

The substrate 100 may include silicon, germanium, silicon-germanium, or a III-V compound such as GaP, GaAs, GaSb, etc. In some embodiments, the substrate 100 may be a silicon-on-insulator (SOI) substrate or a germanium-on-insulator (GOI) substrate.

The first region I of the substrate 100 may be a cell array region in which memory cells may be formed, and the third region III of the substrate 100 may be a circuit region in which circuit patterns for driving the memory cells may be formed. The second region II of the substrate 100 also may be a circuit region in which circuit patterns for driving the memory cells may be formed, however, the circuit patterns of the circuit region may have similar structures to those of the memory cells. In example embodiments, the second region II of the substrate 100 may extend lengthwise in the first direction. An item, layer, or portion of an item or layer described as extending "lengthwise" in a particular direction has a length in the particular direction and a width perpendicular to that direction, where the length is greater than the width.

Hereinafter, only the region X including portions of the first and second regions I and II will be illustrated.

Figure 2:
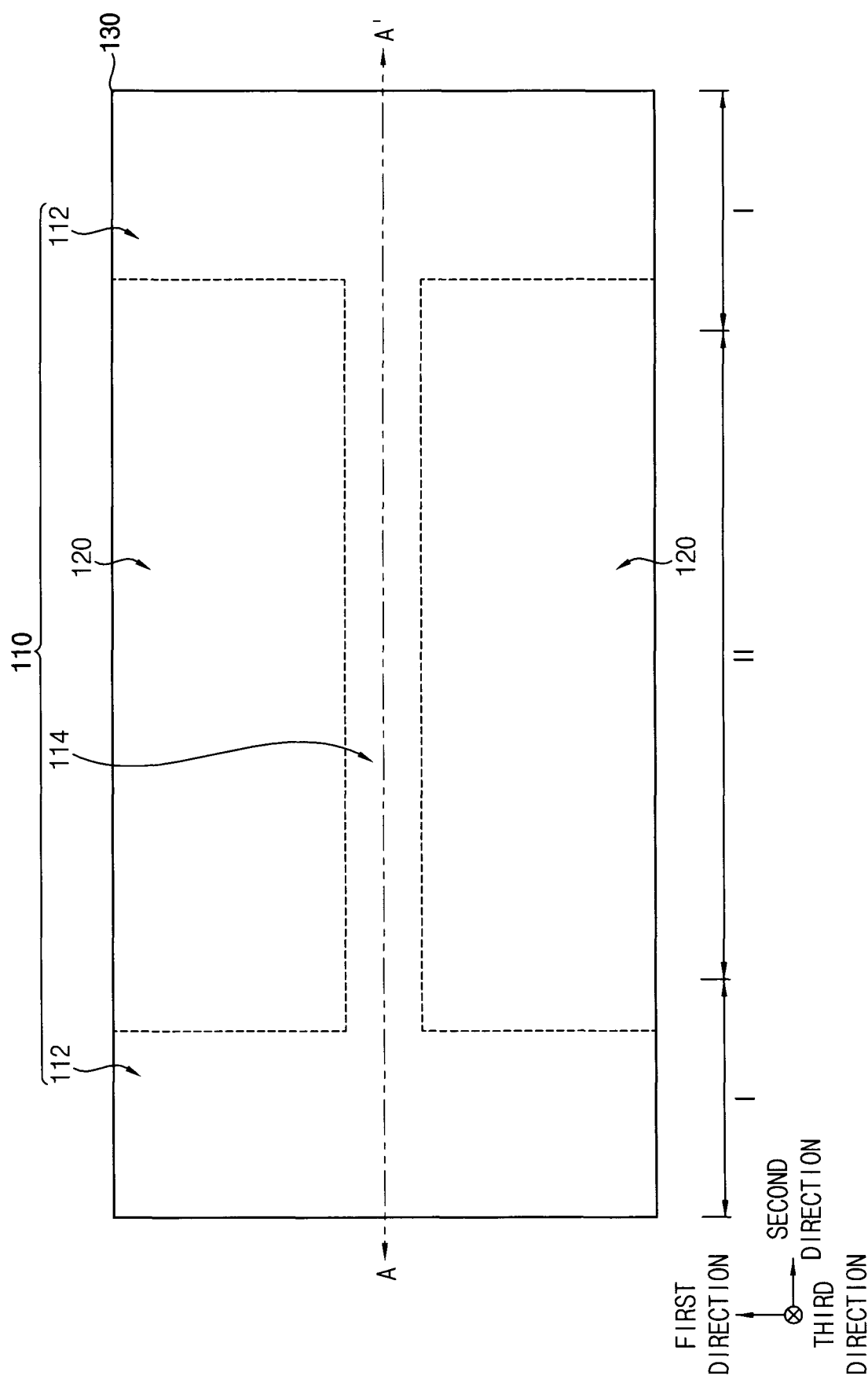
Figure 3:
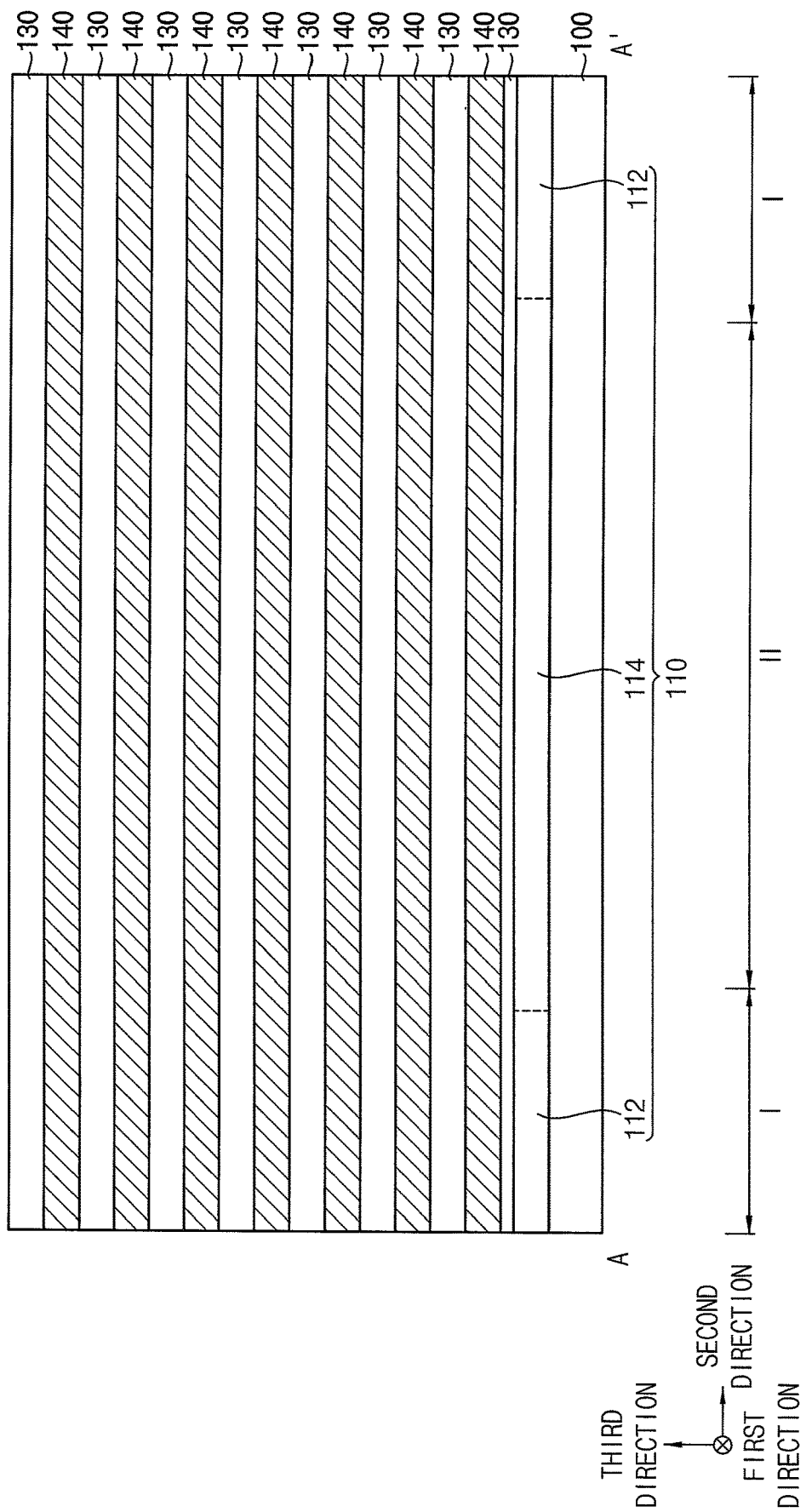

Referring to FIGS. 2 and 3, a first sacrificial layer 110 and a first insulation layer 120 may be formed on the substrate 100, and second insulation layers 130 and second sacrificial layers 140 may be alternately and repeatedly formed on the first sacrificial layer 110 and the first insulation layer 120. Thus, a plurality of second insulation layers 130 and a plurality of second sacrificial layers 140 may be alternately stacked in the third direction. FIG. 3 illustrates the second insulation layers 130 are formed at eight levels and the second sacrificial layers 140 are formed at seven levels, however, the inventive concepts are not limited thereto.

The first sacrificial layer 110 may include a first portion 112 on the first region I of the substrate 100 and a second portion 114 on the second region II of the substrate 100 connected to the first portion 112. In some embodiments, when viewed in cross-section, a vertical boundary between the first portion 112 and the second portion 114 may be located near or at a boundary between the first region I and the second region II. In example embodiments, the second portion 114 of the first sacrificial layer 110 may extend lengthwise in the second direction, and a plurality of second portions 114 may be formed to be spaced apart from each other in the first direction.

The first insulation layer 120 may be formed on a portion of the substrate 100 on which the first sacrificial layer 110 is not formed.

The first and second insulation layers 120 and 130 may include an oxide (e.g., silicon oxide), the second sacrificial layer 140 may include a material having an etching selectivity with respect to the second insulation layer 130 (e.g., a nitride, such as silicon nitride), and the first sacrificial layer 110 may include a material having an etching selectivity with respect to the first and second insulation layers 120 and 130 and the second sacrificial layer 140 (e.g., silicon-germanium).

A photoresist pattern (not shown) may be formed on an uppermost one of the second insulation layers 130, and the uppermost one of the second insulation layers 130 and an uppermost one of the second sacrificial layers 140 may be etched using the photoresist pattern as an etching mask. Thus, one of the second insulation layers 130 under the uppermost one of the second sacrificial layers 140 may be partially exposed. After a trimming process in which an area of the photoresist pattern is decreased by a given ratio, the uppermost one of the second insulation layers 130, the uppermost one of the second sacrificial layers 140, the exposed one of the second insulation layers 130, and one of the second sacrificial layers 140 thereunder may be etched again using the reduced photoresist pattern as an etching mask. The trimming process and the etching process may be repeatedly performed to form a mold including a plurality of steps each of which may consist of one of the second sacrificial layers 140 and one of the second insulation layers 130 on the first and second regions I and II of the substrate 100.

Figure 4:
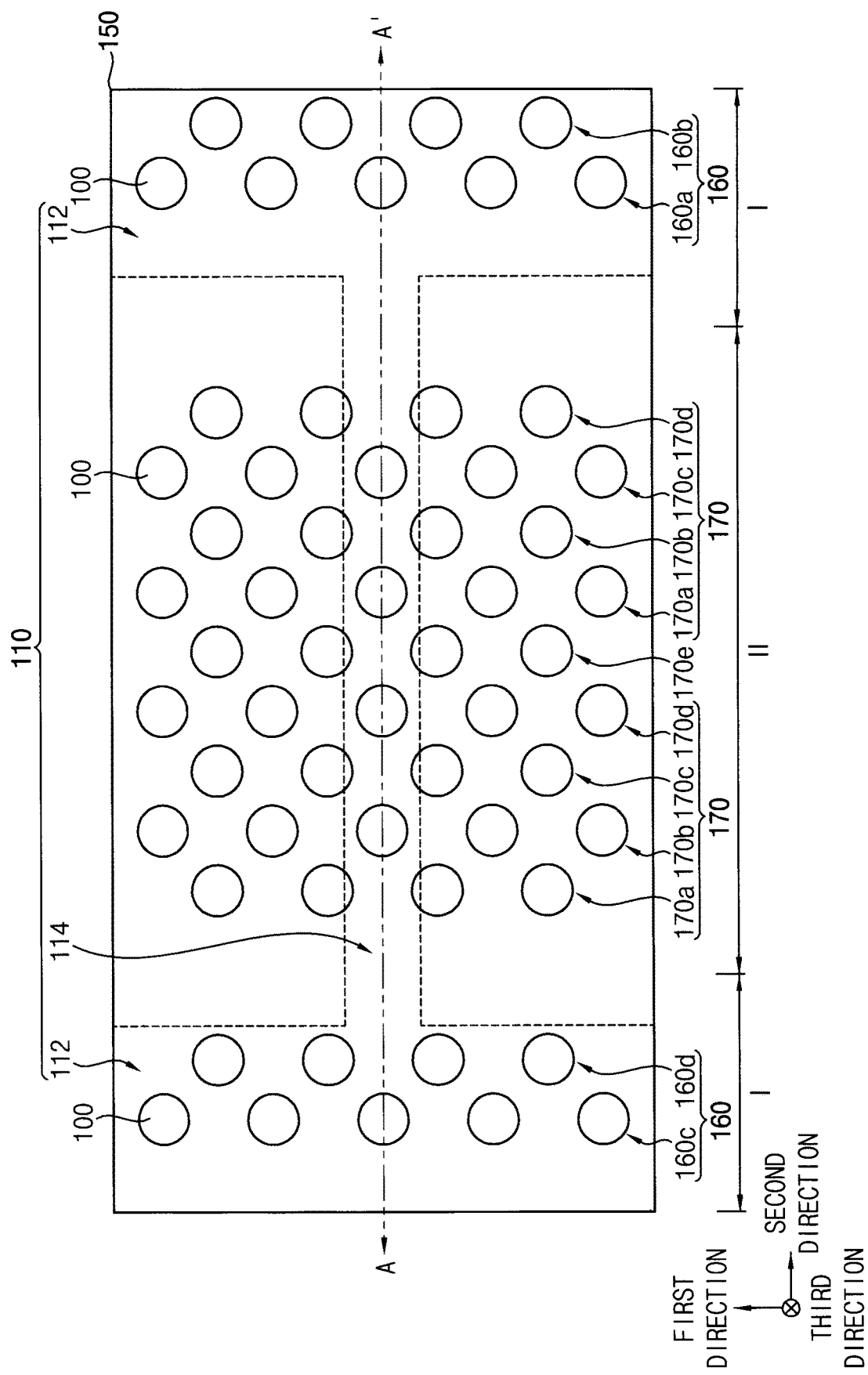

Referring to FIGS. 4 and 5, a first insulating interlayer 150 may be formed on the substrate 100 to cover the mold, and an upper portion of the first insulating interlayer 150 may be planarized.

The planarization process may be performed by, e.g., a chemical mechanical polishing (CMP) process and/or an etch back process until an upper surface of the uppermost one of the second insulation layers 130 may be exposed, or to a height higher than the upper surface of the uppermost one of the second insulation layers 130.

A first mask (not shown) may be formed on the first insulating interlayer 150, and the first insulating interlayer 150, the second insulation layers 130, the second sacrificial layers 140, the first sacrificial layer 110, and the first insulation layer 120 may be etched using the first mask as an etching mask to form first and second channel holes 160 and 170 exposing upper surfaces of the first and second regions I and II, respectively, of the substrate 100. In some embodiments, the first and second channel holes 160 and 170 may be recessed below an uppermost top surface of the substrate 100.

A plurality of second channel holes 170 may be formed in each of the first and second directions to form a second channel hole array. In example embodiments, the second channel hole array may include a first channel hole column 170a including ones of the second channel holes 170 disposed in the first direction, and a second channel hole column 170b including ones of the second channel holes 170 disposed in the first direction and being spaced apart from the first channel hole column 170a in the second direction. The ones of the second channel holes 170 included in the first channel hole column 170a may be disposed to have acute angles with respect to the first direction from the ones of the second channel holes 170 included in the second channel hole column 170b.

The first and second channel hole columns 170a and 170b may be alternately and repeatedly disposed in the second direction. FIG. 4 shows five first channel hole columns 170a and four second channel hole columns 170b alternately disposed in the second direction to form a second channel hole group, however, the inventive concepts are not limited thereto.

Hereinafter, four channel hole columns disposed in the second direction in the second channel hole group may be referred to as first, second, third and fourth channel hole columns 170a, 170b, 170c, and 170d, respectively, in this order, one channel hole column at a central position in the second direction in the second channel hole group may be referred to as a fifth channel hole column 170e, and the other four channel hole columns disposed in the second direction in the second channel hole group may be referred to as the first, second, third and fourth channel hole columns 170a, 170b, 170c, and 170d, respectively, again in this order. The first, second, third and fourth channel hole columns 170a,

170*b*, 170*c* and 170*d* disposed in the second direction may define one channel hole block.

In example embodiments, at least one of second channel hole rows, each of which may include ones of the second channel holes 170 disposed in the second direction, may extend through the second portion 114 of the first sacrificial layer 110. For example, each second channel hole row may comprise channel holes 170 having center axis that are aligned with one another in the second direction, and channel holes 170 of at least one of these second channel hole rows may extend through the second portion 114 and be recessed below an uppermost top surface of the substrate 100.

Like the second channel hole array including the second channel holes 170 on the second region II of the substrate 100, a first channel hole array including the first channel holes 160 may be defined. The first channel hole array may include a plurality of first channel hole groups spaced apart from each other in the second direction, and each of the first channel hole groups may include a channel hole block, for example, including first, second, third and fourth channel hole columns 160*a*, 160*b*, 160*c* and 160*d*, disposed in the second direction at each of opposite sides of a fifth channel hole column (not shown).

Referring to FIGS. 6 and 7, after the first mask is removed, a first blocking layer, a charge storage layer, a tunnel insulation layer, and a first spacer layer (not shown) may be sequentially formed on sidewalls of the first and second channel holes 160 and 170, the upper surface of the semiconductor pattern 230, and an upper surface of the first insulating interlayer 150. The first spacer layer may be anisotropically etched to form a first spacer (not shown) on the sidewalls of the first and second channel holes 160 and 170. In the first channel holes 160, the tunnel insulation layer, the charge storage layer, and the first blocking layer may be etched using the first spacer as an etching mask to form, respectively, a first tunnel insulation pattern 202, a first charge storage pattern 192, and a first blocking pattern 182 having a cup shape of which a bottom is opened on the upper surface of the substrate 100 and the sidewall of each of the first channel holes 160, which may form a first charge storage structure 212. Additionally, in the second channel holes 170, the tunnel insulation layer, the charge storage layer, and the first blocking layer may be etched using the first spacer as an etching mask to form, respectively, a second tunnel insulation pattern 204, a second charge storage pattern 194, and a second blocking pattern 184 having a cup shape of which a bottom is opened on the upper surface of the substrate 100 and the sidewall of each of the second channel holes 170, which may form a second charge storage structure 214. Top surfaces of the first tunnel insulation pattern 202, the first charge storage pattern 192, and the first blocking pattern 182 may be located at a vertical level between upper and lower surfaces (e.g., higher than the lower surface and lower than the upper surface) of the uppermost one of the second insulation layers 130. Top surfaces of the second tunnel insulation pattern 204, the second charge storage pattern 194, and the second blocking pattern 184 may be located at a vertical level between upper and lower surfaces (e.g., higher than the lower surface and lower than the upper surface) of the uppermost one of the second insulation layers 130. In some embodiments, top surfaces of the first tunnel insulation pattern 202, the first charge storage pattern 192, the first blocking pattern 182, the second tunnel insulation pattern 204, the second charge storage pattern 194, and the second blocking pattern 184 may be coplanar with one another.

The first blocking layer and the tunnel insulation layer may include an oxide, e.g., silicon oxide, and the charge storage layer may include a nitride, e.g., silicon nitride.

After removing the first spacer, a first semiconductor layer may be formed on the exposed upper surface of the substrate 100, the first and second tunnel insulation patterns 202 and 204, and the first insulating interlayer 150, and a filling layer may be formed on the first semiconductor layer to fill remaining portions of the first and second channel holes.

The first semiconductor layer may be, e.g., polysilicon or amorphous silicon, and the filling layer may include an oxide, e.g., silicon oxide. When the first semiconductor layer includes amorphous silicon, a laser epitaxial growth (LEG) process or a solid phase epitaxy (SPE) process may be further performed so that amorphous silicon may be converted into crystalline silicon.

The filling layer and the first semiconductor layer may be planarized until the upper surface of the first insulating interlayer 150 is exposed so that a first filling pattern 232 may be formed to fill each of the first channel holes 160, and the first semiconductor layer may be transformed into a first channel 222 in each of the first channel holes 160. Additionally, with the planarization of the filling layer and the first semiconductor layer, a second filling pattern 234 may be formed to fill each of the second channel holes 170, and the first semiconductor layer may be transformed into a second channel 224 in each of the second channel holes 170.

Accordingly, the first charge storage structure 212, the first channel 222, and the first filling pattern 232 may be sequentially stacked in each of the first channel holes 160 on the substrate 100, and the second charge storage structure 214, the second channel 224, and the second filling pattern 234 may be sequentially stacked in each of the second channel holes 170 on the substrate 100. Each of the first and second channels 222 and 224 may have a cup-like shape. In some embodiments, the first and second channels 222 and 224 may extend lower than the opening in the bottom of the first and second charge storage structures 212 and 214.

As the first and second channel holes 160 and 170 in which the first and second channels 222 and 224 are formed, respectively, may form the first and second channel hole arrays, the first and second channels 222 and 224 may also form first and second channel arrays, respectively. The first channel array may include first, second, third and fourth channel columns 222*a*, 222*b*, 222*c*, and 222*d* (referring to FIG. 8), and a fifth channel column (not shown) corresponding to the first, second, third and fourth channel hole columns 160*a*, 160*b*, 160*c* and 160*d* and the fifth channel hole column as described above. Likewise, the second channel array may include first, second, third, fourth and fifth channel columns 224*a*, 224*b*, 224*c*, 224*d* and 224*e* (referring to FIG. 8) corresponding to the first, second, third, fourth, and fifth channel hole columns 170*a*, 170*b*, 170*c*, 170*d* and 170*e* as described above.

The first and second channels 222 and 224 may include a semiconductor material, e.g., polysilicon, and thus may be referred to as first and second semiconductor patterns 222 and 224, respectively.

An upper portion of a first structure including the first filling pattern 232, the first channel 222, and the first charge storage structure 212 may be removed to form a first trench, and a first pad 242 may be formed to fill the first trench. Likewise, an upper portion of a second structure including the second filling pattern 234, the second channel 224, and the second charge storage structure 214 may be removed to form a second trench, and a second pad 244 may be formed to fill the second trench.

In example embodiments, the first and second pads 242 and 244 may include a conductive material, for example, polysilicon doped with n-type or p-type impurities.

Referring to FIGS. 8 to 10, a division pattern structure 250 may be formed through the first insulating interlayer 150, the uppermost one of the second sacrificial layers 140, the uppermost one of the second insulation layers 130, one of the second sacrificial layers 140 at a second level from above (e.g., the next one below the uppermost one of the second sacrificial layers 140), and one of the second insulation layers 130 at a second level from above (e.g., the next one below the uppermost one of the second insulation layers 130).

In example embodiments, the division pattern structure 250 may include first and second division patterns 252 and 254 on the second region II of the substrate 100. The first division pattern 252 may extend lengthwise in the first direction, and the second division pattern 254 may extend lengthwise in the second direction from the first division pattern 252. In some embodiments, the first division pattern 252 may intersect the second division pattern 254. The first division pattern 252 and second division pattern 254 may divide uppermost ones of the second sacrificial layer 140 (e.g., the second sacrificial layers 140 at an uppermost level and a second level from above). In an example embodiment, the first division pattern 252 may extend through ones of the second channels 224 of the fifth channel column 224e included in the second channel array.

In example embodiments, at least one pair of second division patterns 254 may be formed to be spaced apart from each other in the first direction on the second region II of the substrate 100. For example, at least one pair of second division patterns 254 may be parallel to one another. Top surfaces of the first and second division patterns 252 and 254 may be coplanar with a top surface of the first insulating interlayer 150. Side surfaces of the first and second division patterns 252 and 254 may be substantially vertical (e.g., perpendicular to the top surface of the substrate 100). In a plan view, a space between the pair of the second division patterns 254 may overlap the second portion 114 of the first sacrificial layer 110.

A plurality of pairs of second division patterns 254 may be formed to be spaced apart from each other in the first direction, which may be connected with each other by the first division pattern 252 extending lengthwise in the first direction. The second portion 114 of the first sacrificial layer 110 may be formed correspondingly to the space between the pair of the second division patterns 254.

A third division pattern (not shown) may be formed to extend lengthwise in the first direction on the first region I of the substrate 100, which may extend through ones of the first channels 222 of the fifth channel column included in the first channel array.

In the figure, the first and second division patterns 252 and 254 and the third division pattern extend to the one of the second sacrificial layers 140 at the second level; however, the inventive concepts are not limited thereto. For example, the first and second division patterns 252 and 254 and the third division pattern extend to the uppermost one of the second sacrificial layers 140.

The first and second division patterns 252 and 254 and the third division pattern may include an oxide, e.g., silicon oxide.

Figure 11:
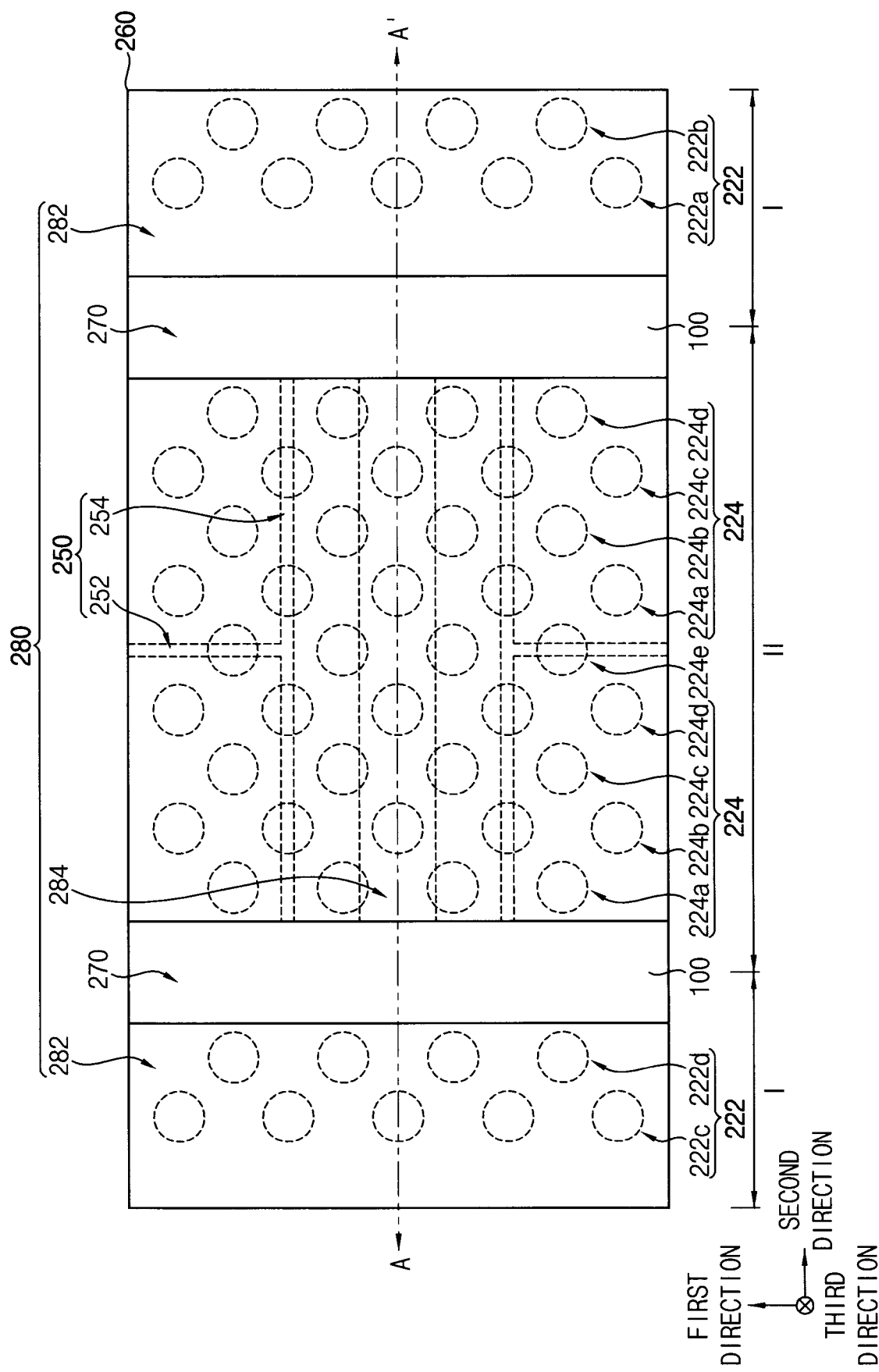
Figure 12:
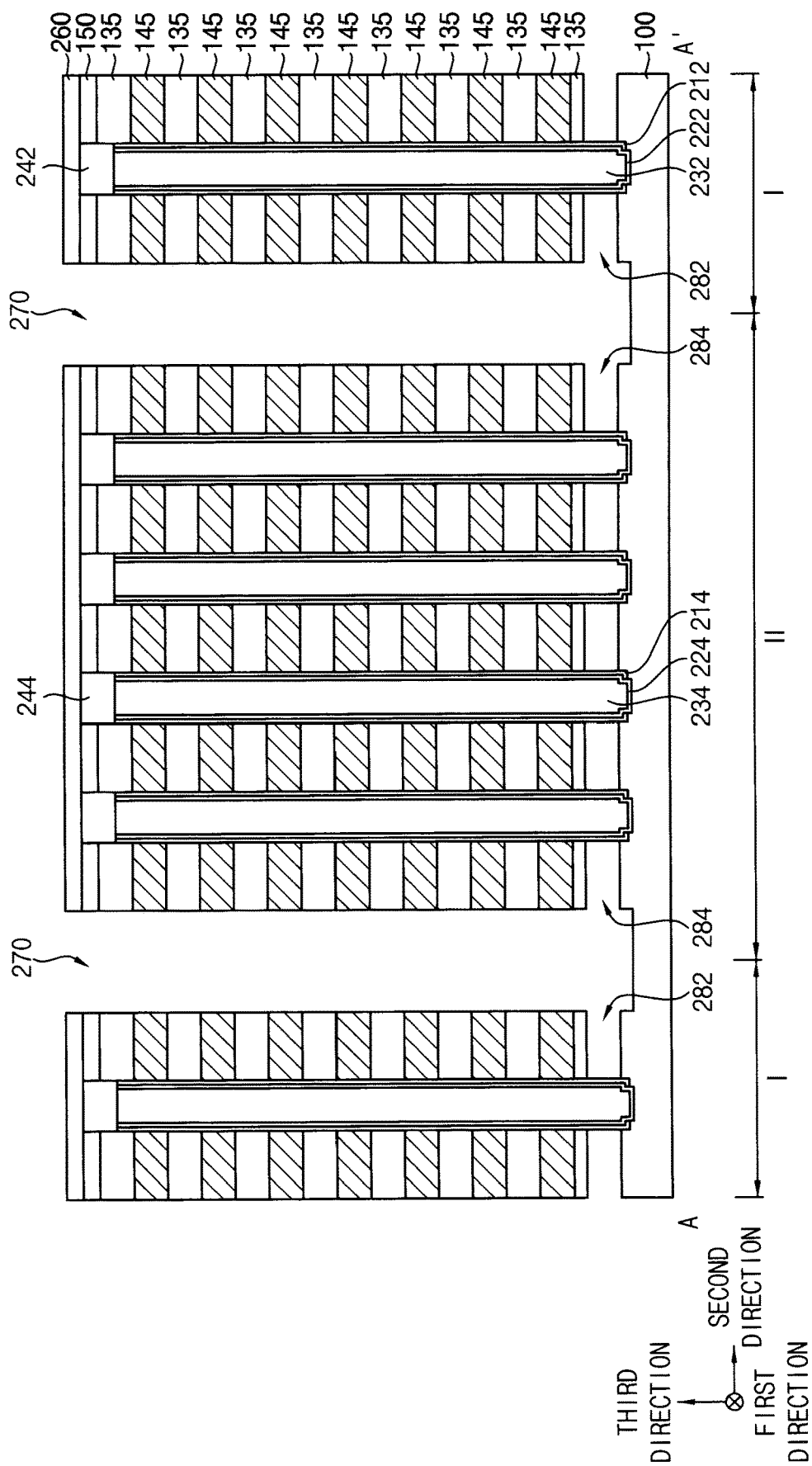

Referring to FIGS. 11 and 12, a second insulating interlayer 260 may be formed on the first insulating interlayer 150, the division pattern structure 250, and the first and second pads 242 and 244.

A second mask (not shown) may be formed on the second insulating interlayer 260, and an opening 270 may be formed through the second insulating interlayer 260, the first insulating interlayer 150, the second insulation layers 130, the second sacrificial layers 140, the first sacrificial layer 110, and the first insulation layer 120 to expose an upper surface of the substrate 100. The second insulating interlayer 260 may include an oxide, e.g., silicon oxide, and thus may be merged with the first insulating interlayer 150.

The opening 270 may be formed between the first channel arrays on the first region I of the substrate 100 and between the first and second channel arrays, e.g., at a boundary between the first and second regions I and II of the substrate 100. Thus, the opening 270 may extend lengthwise in the first direction, and a plurality of openings 270 may be formed in the second direction. In some embodiments, a sidewall of the openings 270 may be substantially vertical. As the opening 270 is formed, the second insulation layer 130 may be transformed into a second insulation pattern 135, the second sacrificial layer 140 may be transformed into a second sacrificial pattern 145, and the first insulation layer 120 may be transformed into a first insulation pattern (not shown).

After removing the second mask, the first sacrificial layer 110 exposed by the opening 270 may be removed to form first and second gaps 282 and 284 between the upper surface of the substrate 100 and a lowermost one of the second insulation patterns 135. The first gap 282 may be formed by removing the first portion 112 of the first sacrificial layer 110, and the second gap 284 may be formed by removing the second portion 114 of the first sacrificial layer 110. Thus, the first gap 282 may be formed on the first region I of the substrate 100, and one or a plurality of second gaps 284 may be formed to extend in the second direction on the second region II of the substrate 100.

Figure 13:
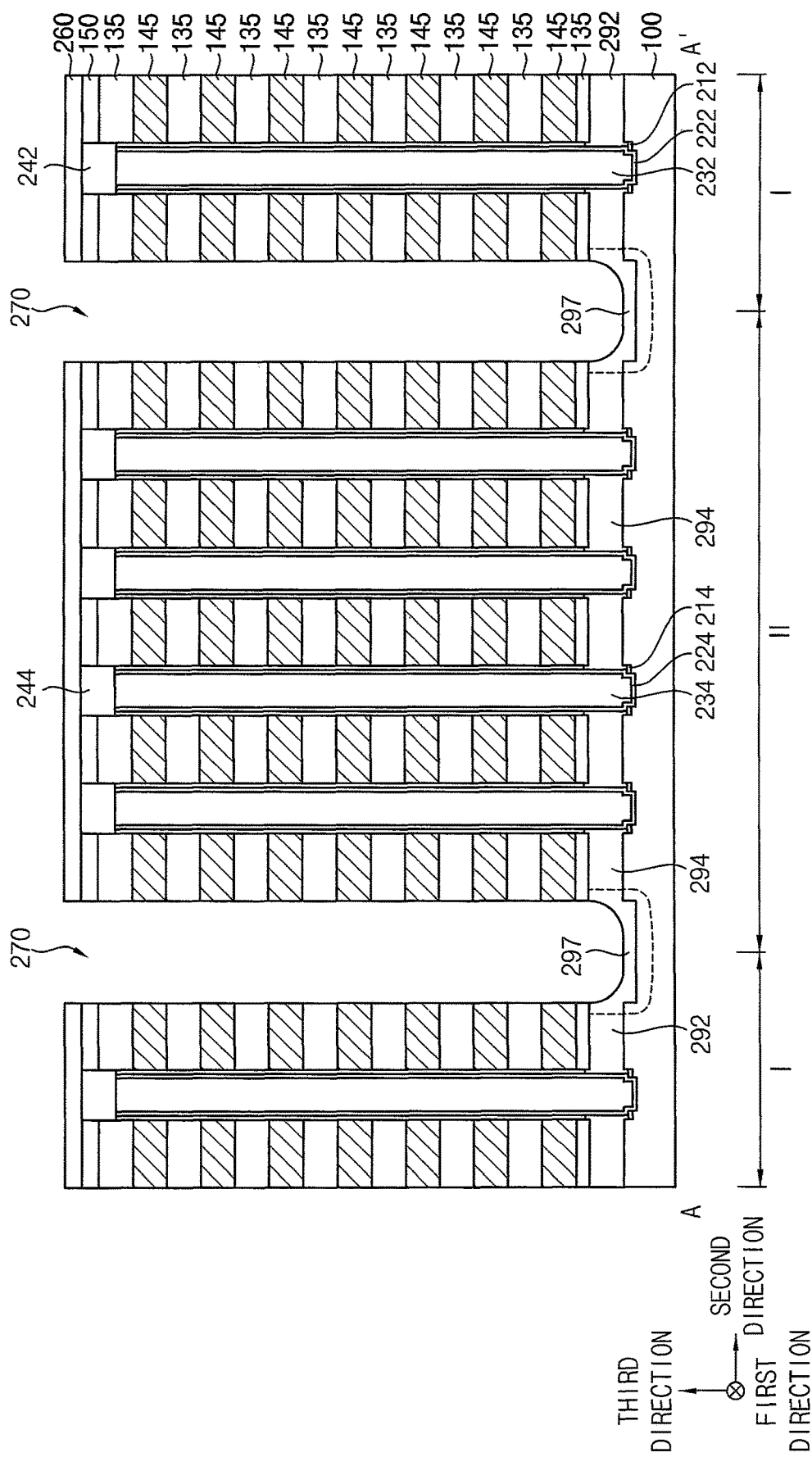

Referring to FIG. 13, portions of the first and second charge storage structures 212 and 214 exposed by the first and second gaps 282 and 284, respectively, may be removed, and third and fourth semiconductor patterns 292 and 294 may be formed to fill the first and second gaps 282 and 284, respectively. For example, the third and fourth semiconductor patterns 292 and 294 may be formed between an upper surface of the substrate 100 and a lowermost one of the second isolation patterns 135.

The third and fourth semiconductor patterns 292 and 294 may be formed by forming a second semiconductor layer to fill the first and second gaps 282 and 284 and removing a portion of the second semiconductor layer on a sidewall of the opening 270. A portion of the second semiconductor layer at a lower portion of the opening 270 may not be entirely removed, and thus may remain.

As the third semiconductor pattern 292 is formed in the first gap 282, the first channels 222 on the first region I of the substrate 100 may be connected with each other. As the fourth semiconductor pattern 294 is formed in the second gap 284, ones of the second channels 224 on the second region II of the substrate 100 may be connected with each other. As described above, the third and fourth semiconductor patterns 292 and 294 may be connected with each other by the second semiconductor layer remaining at a lower portion of the opening 270.

In example embodiments, the third and fourth semiconductor patterns 292 and 294 may be, e.g., doped or undoped polysilicon.

For example, n-type impurities may be implanted into the second semiconductor layer at the lower portion of the opening 270 to form a first impurity region 297, which may extend lengthwise in the first direction.

Figure 14:
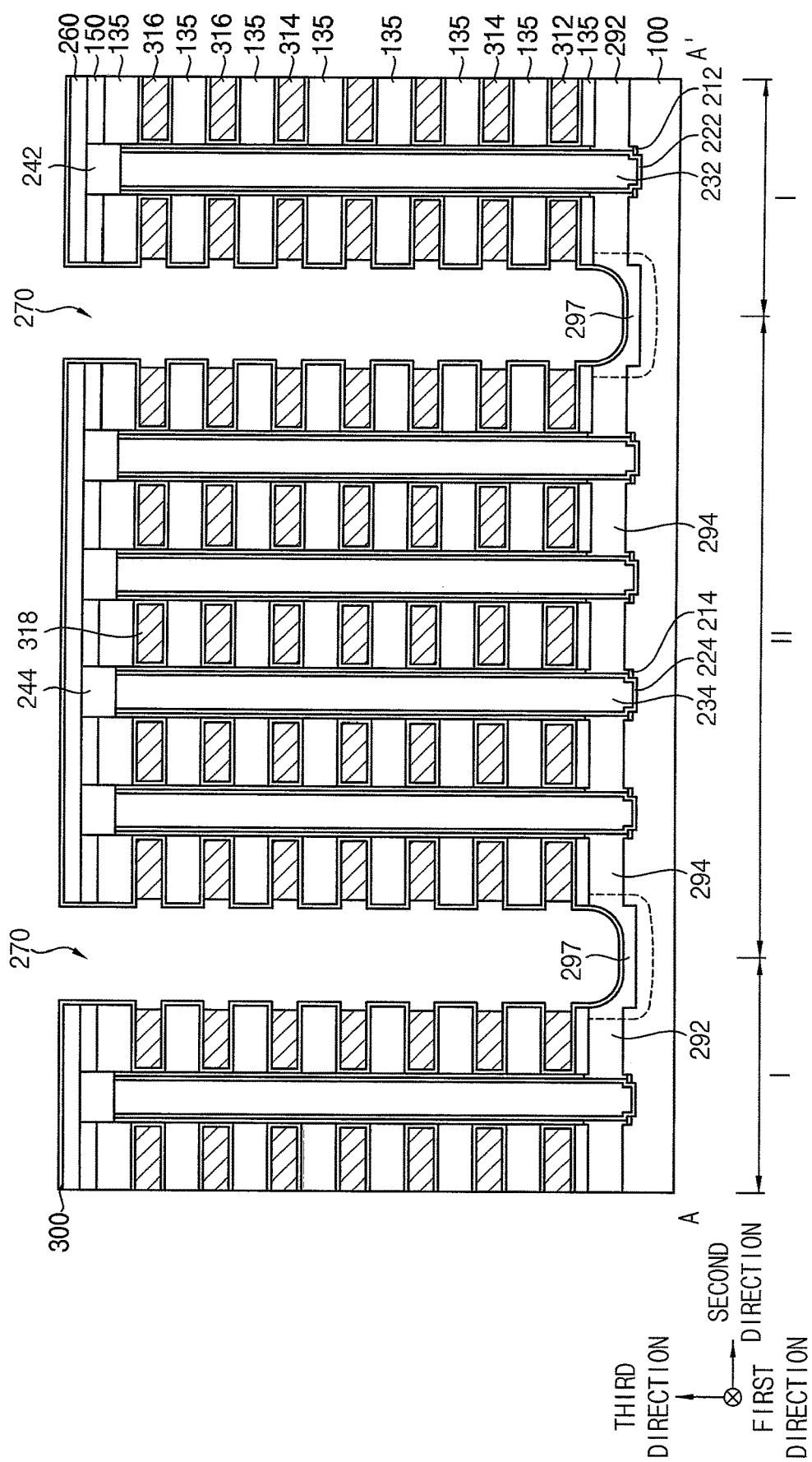

Referring to FIG. 14, the second sacrificial patterns 145 exposed by the opening 270 may be removed to form a third gap between the second insulation patterns 135 at respective levels, and between the lowermost one of the second insulation pattern 135 and the third and fourth semiconductor patterns 292 and 294, and portions of outer sidewalls of the first and second charge storage structures 212 and 214 may be exposed by the third gap. In example embodiments, the second sacrificial patterns 145 may be removed by a wet etching process using a solution including phosphoric acid or sulfuric acid.

A second blocking layer 300 may be formed on the exposed portions of the outer sidewalls of the first and second charge storage structures 212 and 214, an inner wall of the third gap, a surface of the first insulation pattern, surfaces of the second insulation patterns 135, an upper surface of the first impurity region 297, and an upper surface of the second insulating interlayer 260, and a conductive layer may be formed on the second blocking layer 300 to fill a remaining portion of the third gap. A barrier layer (not shown) may be further formed between the second blocking layer 300 and the conductive layer. The conductive layer may be partially removed to form a conductive line in the third gap.

The conductive line may include a metal having a low resistance, e.g., tungsten, titanium, tantalum, platinum, etc., and the barrier layer may include a metal nitride, e.g., titanium nitride, tantalum nitride, etc.

In example embodiments, the conductive line may extend in the first direction, and a plurality of conductive lines may be formed in the second direction. For example, the conductive lines, each of which may extend in the first direction, may be spaced apart from each other in the second direction by the opening 270. Additionally, a plurality of conductive lines may be formed at a plurality of levels, respectively, to be spaced apart from each other, which may form a conductive line structure.

The conductive line structure on the first region I of the substrate 100 may include a ground selection line (GSL) 312, a word line 314, and a string selection line (SSL) 316 sequentially stacked in the third direction. The GSL 312 may be formed at a lowermost level, each of the word line 314 and the SSL 316 may be formed at one or a plurality of levels on the GSL 312. In example embodiments, the SSL 316 may be formed at an uppermost level and a second level from above, and the word lines 314 may be formed at a plurality of levels, respectively, between the GSL 312 and the SSL 316.

The conductive line structure on the second region II of the substrate 100 may include a plurality of conductive lines sequentially stacked in the third direction, and an uppermost one of the plurality of conductive lines may be referred to as a first conductive line 318. In some embodiments, the plurality of conductive lines on the second region II may be at the same vertical levels as corresponding ones of the ground selection line (GSL) 312, the word lines 314, and the string selection lines (SSL) 316 on the first region I.

The first division pattern 252 may divide upper ones of the conductive lines. For example, in some embodiments, the first division pattern 252 may extend through and divide the first conductive line 318. In other example embodiments, the first division pattern 252 may extend through and divide the first conductive line 318 and the conductive line at a level immediately below the first conductive line 318.

Figure 15:
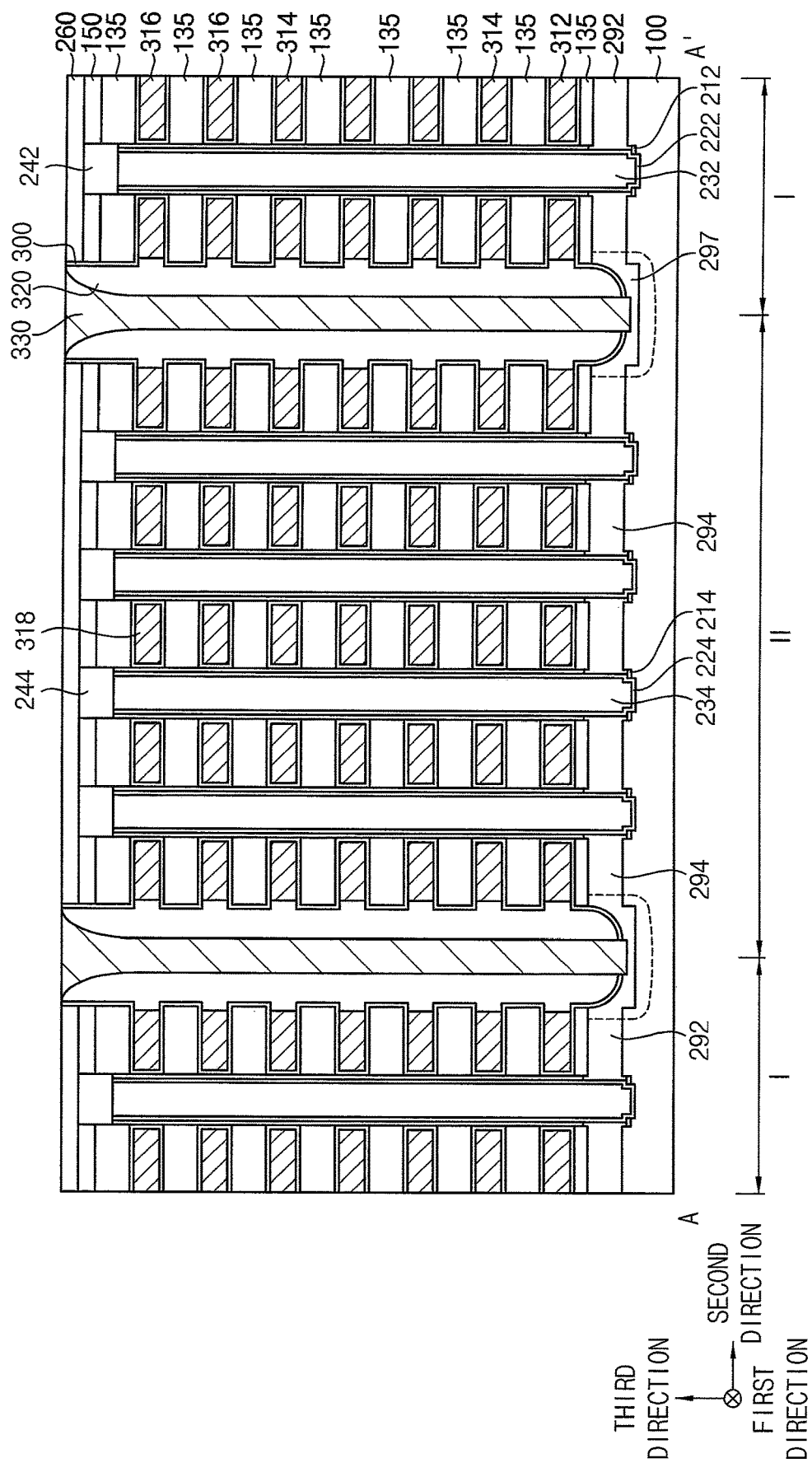

Referring to FIG. 15, a second spacer layer may be formed on the sidewall of the opening 270, the upper surface of the second insulating interlayer 260, and the upper surface of the first impurity region 297, and the second spacer layer may be anisotropically etched to form a second spacer 320. Thus, a portion of the first impurity region 297 at an upper portion of the substrate 100 may be exposed. The second spacer layer may include an insulating material, e.g., an oxide or a nitride.

A common source line (CSL) 330 may be formed on the exposed portion of the first impurity region 297 to fill the opening 270. The CSL 330 may be formed in the opening 270 to contact the upper surface of the first impurity region 297. The CSL 330 may include a conductive material, e.g., a metal, a metal nitride, etc.

Figure 16:
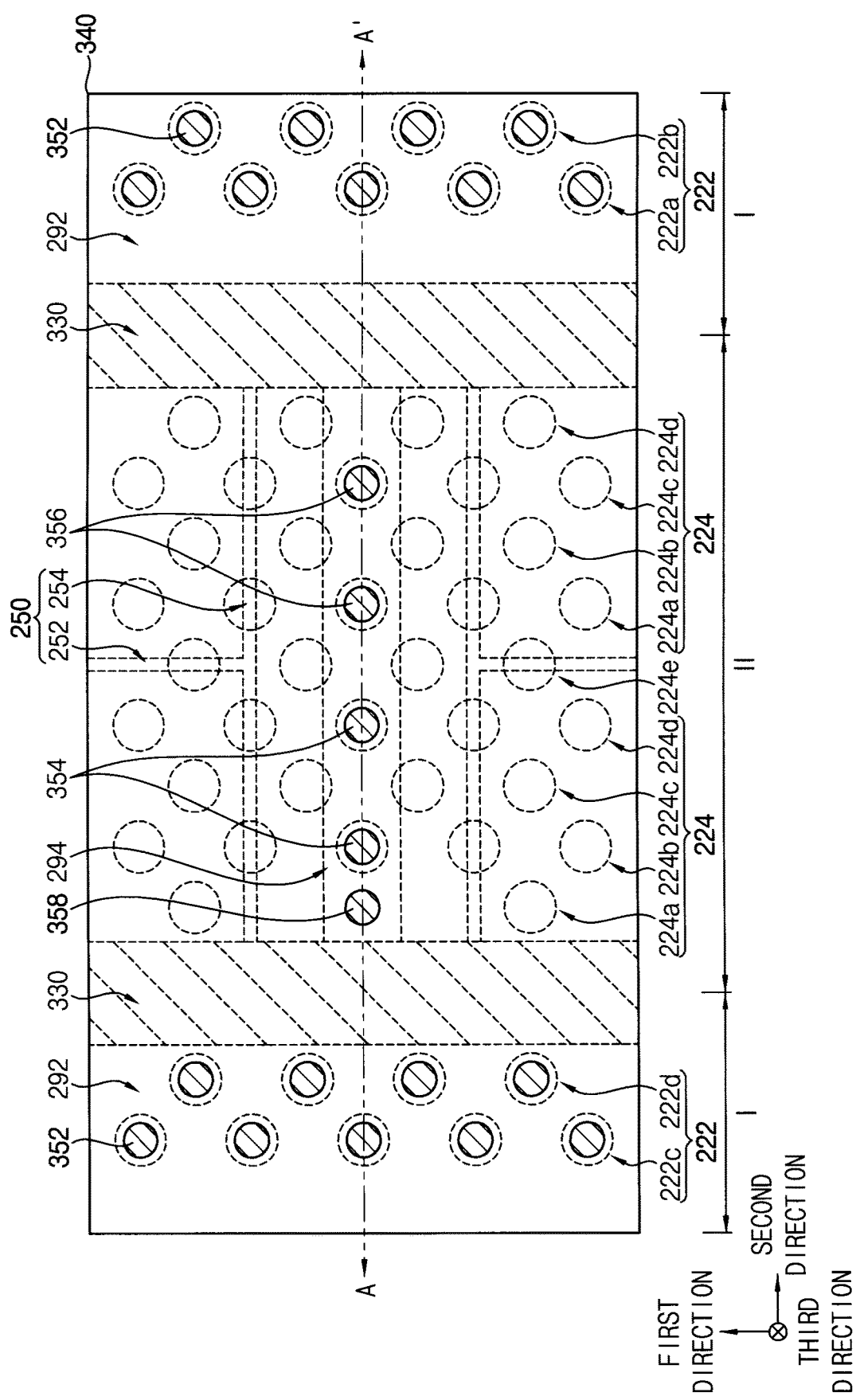
Figure 17:
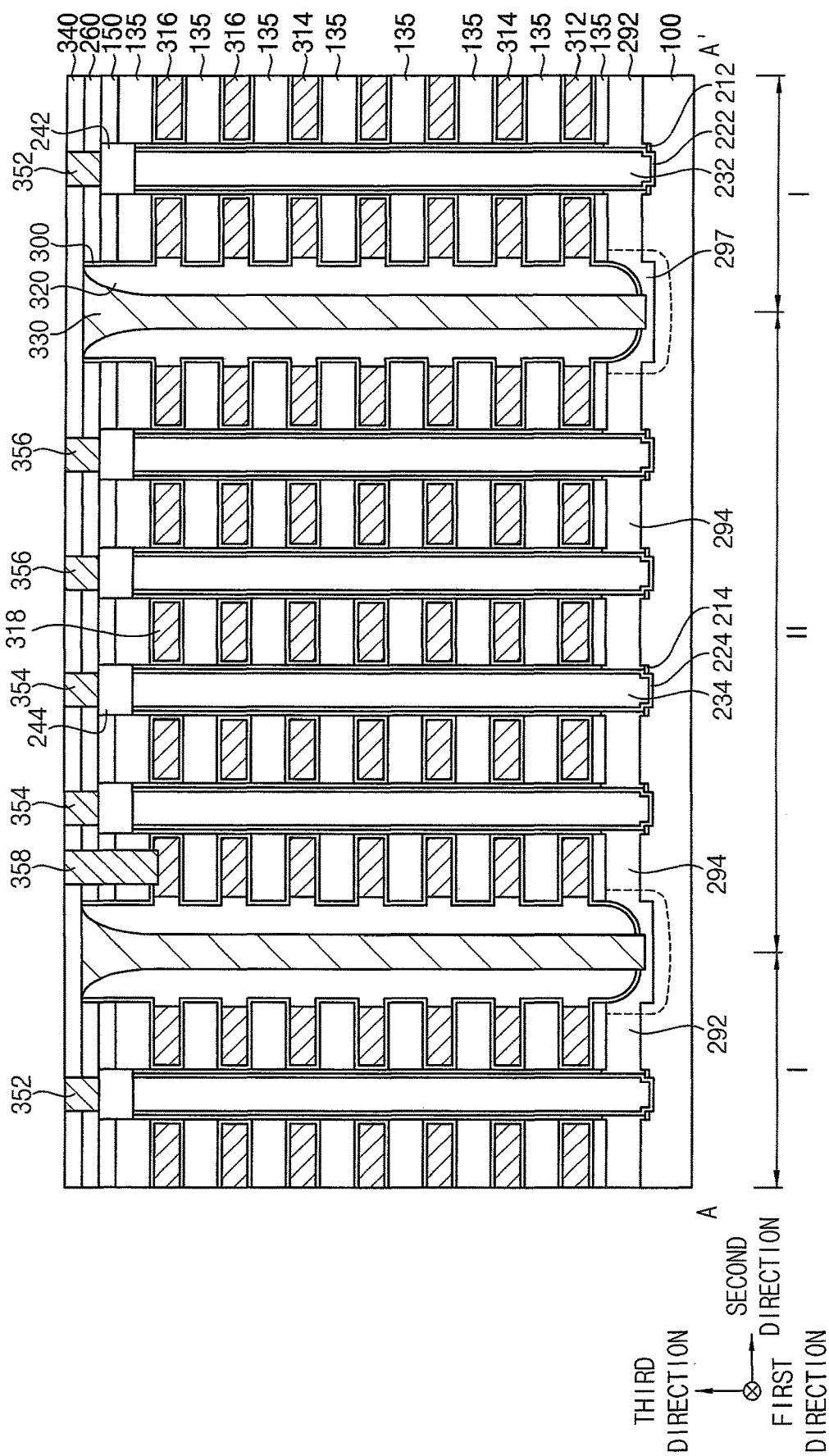

Referring to FIGS. 16 and 17, after forming a third insulating interlayer 340 on the second insulating interlayer 260, the CSL 330, the second spacer 320, and the second blocking layer 300, first contact plugs 352 may be formed to extend through the second and third insulating interlayers 260 and 340 to contact the first pads 242, second and third contact plugs 354 and 356 may be formed to extend through the second and third insulating interlayers 260 and 340 to contact the second pads 244, and a fourth contact plug 358 may be formed to extend through the first to third insulating interlayers 150, 260 and 340, the uppermost one of the second insulation patterns 135, and the second blocking layer 300 to contact a portion of the first conductive line 318. Upper surfaces of the second to fourth contact plugs 354, 356, and 358 may be coplanar with one another and with an upper surface of the third insulating interlayer 340.

In example embodiments, the second and third contact plugs 354 and 356 may be formed on the second pads 244 on the second channels 224, which may extend through the fourth semiconductor pattern 294 to be connected thereto. One or a plurality of second contact plugs 354 and one or a plurality of third contact plugs 356 may be formed. The fourth contact plug 358 may be formed on a portion of the first conductive line 318 between a pair of second division patterns 254.

The first to fourth contact plugs 352, 354, 356, and 358 may include a metal, a metal nitride, doped polysilicon, etc.

Figure 19A:
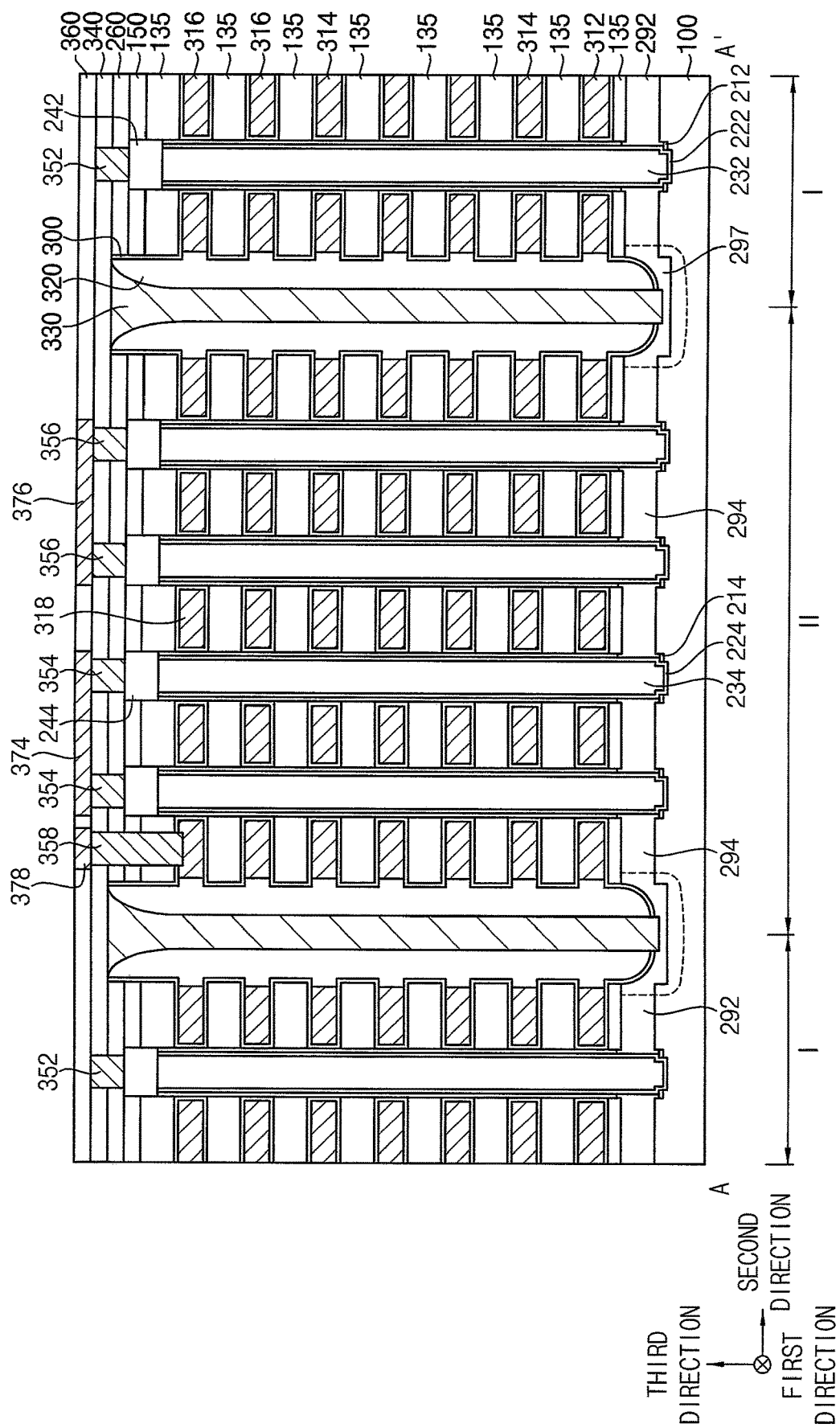

Referring to FIGS. 18 and 19A, after forming a fourth insulating interlayer 360 on the third insulating interlayer 340 and the first to fourth contact plugs 352, 354, 356 and 358, second to fourth wirings 374, 376 and 378 may be formed to extend through the fourth insulating interlayer 360 to contact the second to fourth contact plugs 354, 356 and 358, respectively, to complete the fabrication of the vertical memory device. Top surfaces of the second to fourth wirings 374, 376 and 378 may be coplanar with a top surface of the fourth insulating interlayer 360.

In example embodiments, when a plurality of second contact plugs 354 and a plurality of third contact plugs 356 are formed, the second wirings 374 may be formed to commonly contact upper surfaces of the plurality of second contact plugs 354, and the third wirings 376 may be formed to commonly contact upper surfaces of the plurality of third contact plugs 356.

A first wiring (not shown) may be formed on the first contact plugs 352. In example embodiments, the first wiring may extend lengthwise in the second direction, and a plurality of first wirings may be formed in the first direction. The first wiring may serve as a bit line of the vertical memory device.

The second to fourth wirings 374, 376, and 378 may be formed by a free layout, and may be distinguished from each other and from the first wiring. In some example embodiments, the first wiring may be formed at a level different from those of the second to fourth wirings 374, 376 and 378.

Figure 19B:
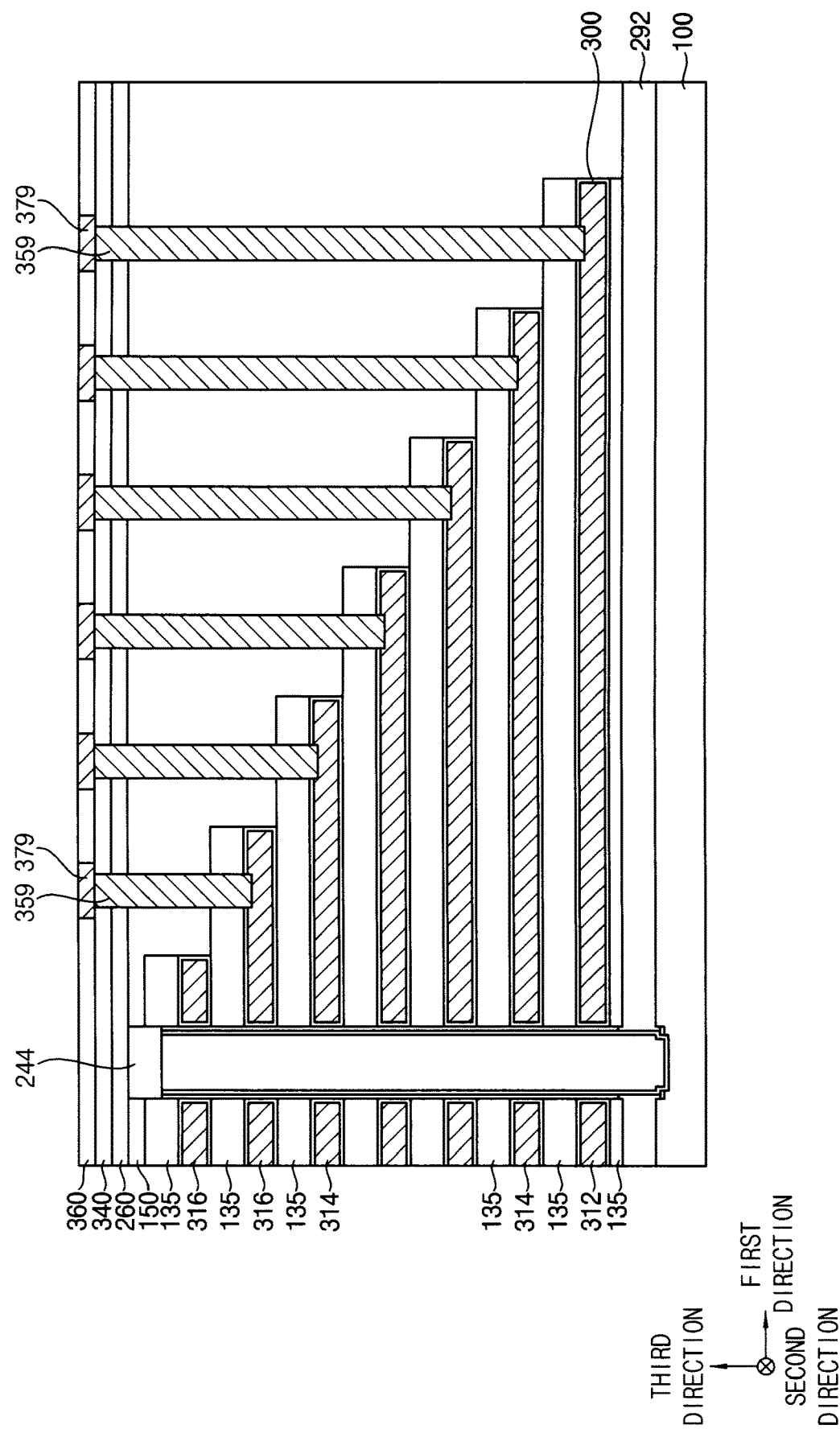

Referring to FIG. 19B, the vertical memory device may further include fifth contact plugs 359 extending through the first to third insulating interlayers 150, 260 and 340, the second insulation pattern 135, and the second blocking layer 300 to contact the conductive lines on the second region II of the substrate 100, and fifth wirings 379 extending through the fourth insulating interlayer 360 to contact the fifth contact plugs 359, respectively.

In example embodiments, the fifth contact plugs 359 may contact upper surfaces of second conductive lines, which are other ones of the conductive lines except the first conductive line.

Figure 20:
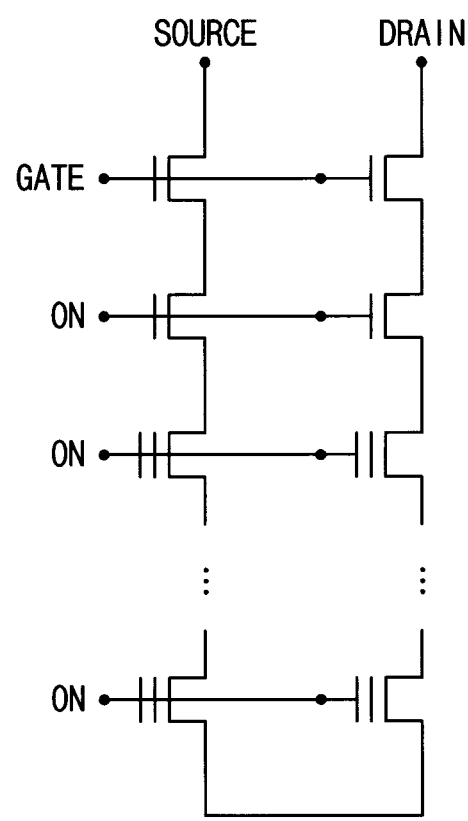
FIG. 20 is an equivalent circuit diagram illustrating a transistor on a second region II of a substrate.

FIG. 20 is an equivalent circuit diagram illustrating a transistor on the second region II of the substrate 100.

Referring to FIG. 20, in the vertical memory device fabricated by the processes illustrated with reference to FIGS. 1 to 19B, circuit patterns for driving memory cells may be formed not only on the third region III of the substrate 100 surrounding the first region I of the substrate 100 but also on the second region II of the substrate 100 in the first region I of the substrate 100.

Particularly, the first conductive line 318 at the uppermost level among the plurality of conductive lines, which may be formed by the same process as the GSL 312, the word line 314 and the SSL 316 stacked in the third direction on the first region I of the substrate 100, may be connected to the fourth contact plug 358 and the fourth wiring 378 so that a gate voltage may be applied thereto. One or ones of the second pads 244 on the second region II of the substrate 100 may be connected to the second contact plug 354 and the second wiring 374 so that a source voltage may be applied thereto. One or ones of the second pads 244 may be connected to the third contact plug 356 and the third wiring 376 so that a drain voltage may be applied thereto.

Thus, the first conductive line 318 may be referred to as a gate electrode, the second contact plug 354 and/or the second wiring 374 may be referred to as a source electrode, and the third contact plug 356 and/or the third wiring 376 may be referred to as a drain electrode. The second semiconductor patterns 224 under the second pads 244 may be connected with each other by the fourth semiconductor pattern 294.

As a result, the first conductive line 318 may serve as a gate electrode of a transistor, one or ones of the second pads 244 may serve as a source region of the transistor, and one or ones of the second pads 244 may serve as a drain region of the transistor. The second semiconductor patterns 224 under the second pads 244 and the fourth semiconductor pattern 294 connecting the second semiconductor patterns 224 may be formed between the source region and the drain region to serve as a channel of the transistor.

In order to secure a space for the fourth contact plug 358 on the first conductive line 318 serving as a gate electrode, the layout of the second channels 224 on the second region II of the substrate 100 may be changed. Thus, FIG. 18 shows that one second channel 224 in the first channel column 224a of the second channel array is not formed.

Extension lengths of the second semiconductor patterns 224 and the fourth semiconductor pattern 294 serving as the channel between the source region and the drain region are relatively long, while a portion thereof controlled by the first conductive line 318 serving as the gate electrode is relatively short, and thus, in order to increase the efficiency of the transistor, erase voltage may be applied to the second conductive lines under the first conductive line 318, so that the amount of current flowing through the channel may be increased. For example, the voltage applied to second conductive lines under the first conductive line may be different from the voltage applied to the first conductive line.

In example embodiments, the erase voltage may be applied by the fifth contact plugs 359 and the fifth wiring 379 contacting the second conductive lines, and thus the fifth contact plugs 359 and the fifth wiring 379 may serve as electrodes.

As illustrated above, some of structures implemented by processes for forming memory cells may be used as circuit patterns for driving the memory cells, and thus the circuit patterns may be formed in the memory cells beside in the region surrounding the memory cells. Accordingly, the area of the third region III of the substrate 100 may be reduced.

The transistor in the second region II of the substrate 100 may have various shapes by changing the layout of the division pattern structure 250, the second pads 244, the second channels 224 and the fourth semiconductor pattern 294, which will be illustrated with reference to FIGS. 21 and 28, hereinafter.

FIGS. 21 to 28 are plan views illustrating vertical memory devices in accordance with example embodiments, and particularly show the region X of FIG. 1.

The vertical memory devices may be the same as that illustrated with reference to FIGS. 18, 19A and 19B, except for the layout of the division pattern structure, the second pads, the second channels, and the fourth semiconductor pattern. Thus, like reference numerals refer to like elements, and detailed descriptions thereon are omitted herein.

Figure 21:
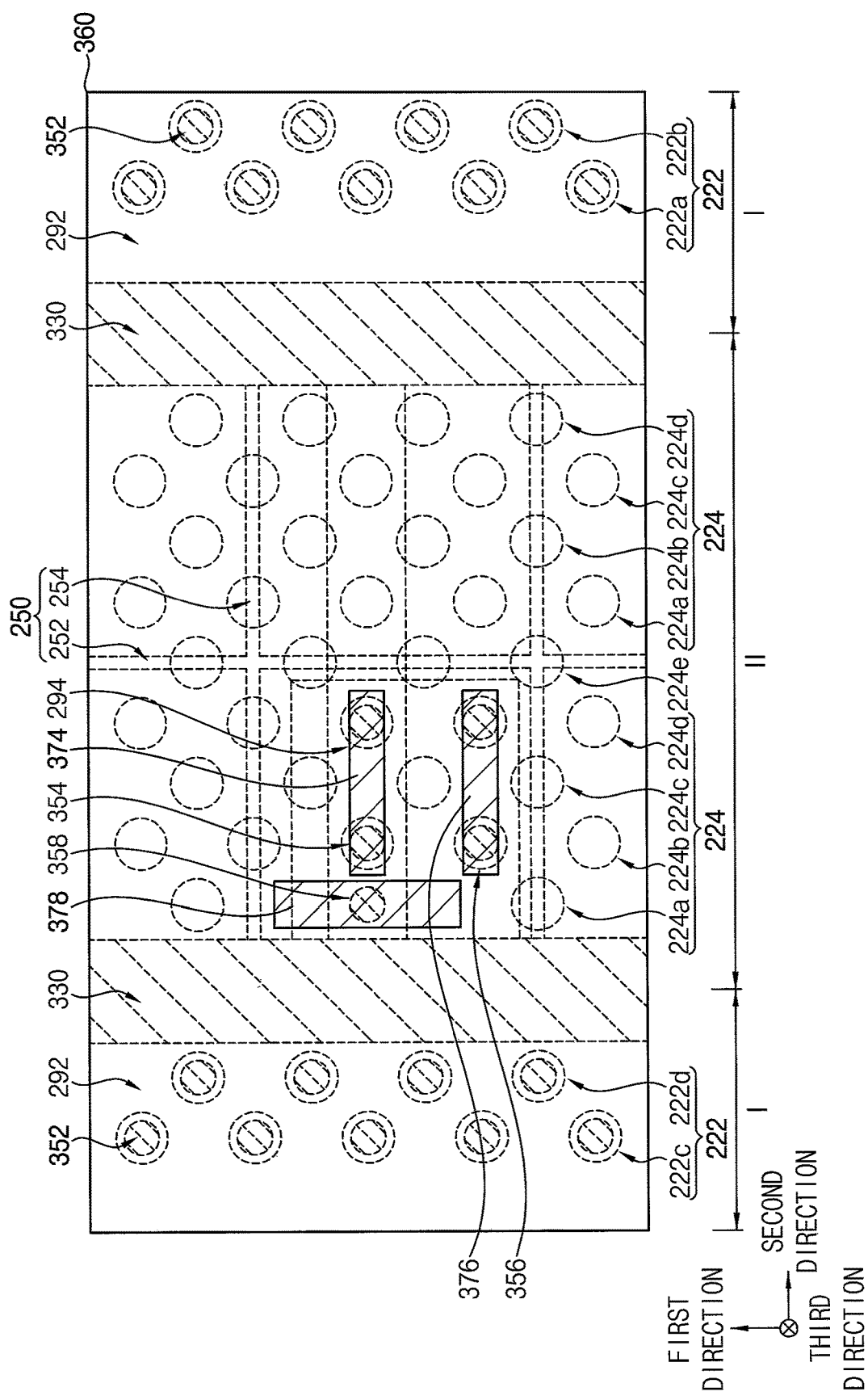
FIGS. 21 to 28 are plan views illustrating vertical memory devices in accordance with example embodiments, and particularly show the region X of FIG. 1.

Referring to FIG. 21, unlike that of FIG. 18, the first division pattern 252 extends lengthwise in the first direction to divide the space between a pair of second division patterns 254 into two, and a transistor may be formed in one of the divided two spaces.

Thus, the fourth semiconductor pattern 294 may have a rectangular shape extending lengthwise in the second direction and entirely overlapping the divided space in the second direction, and each of the second and third contact plugs 354 and 356 may be formed on the neighboring second pads 244, respectively, in the first direction to be spaced apart from each other in the first direction. The second wiring 374 commonly contacting the upper surfaces of the second contact plugs 354 and the third wiring 376 commonly contacting the upper surfaces of the third contact plugs 356 may extend lengthwise in the second direction.

Figure 22:
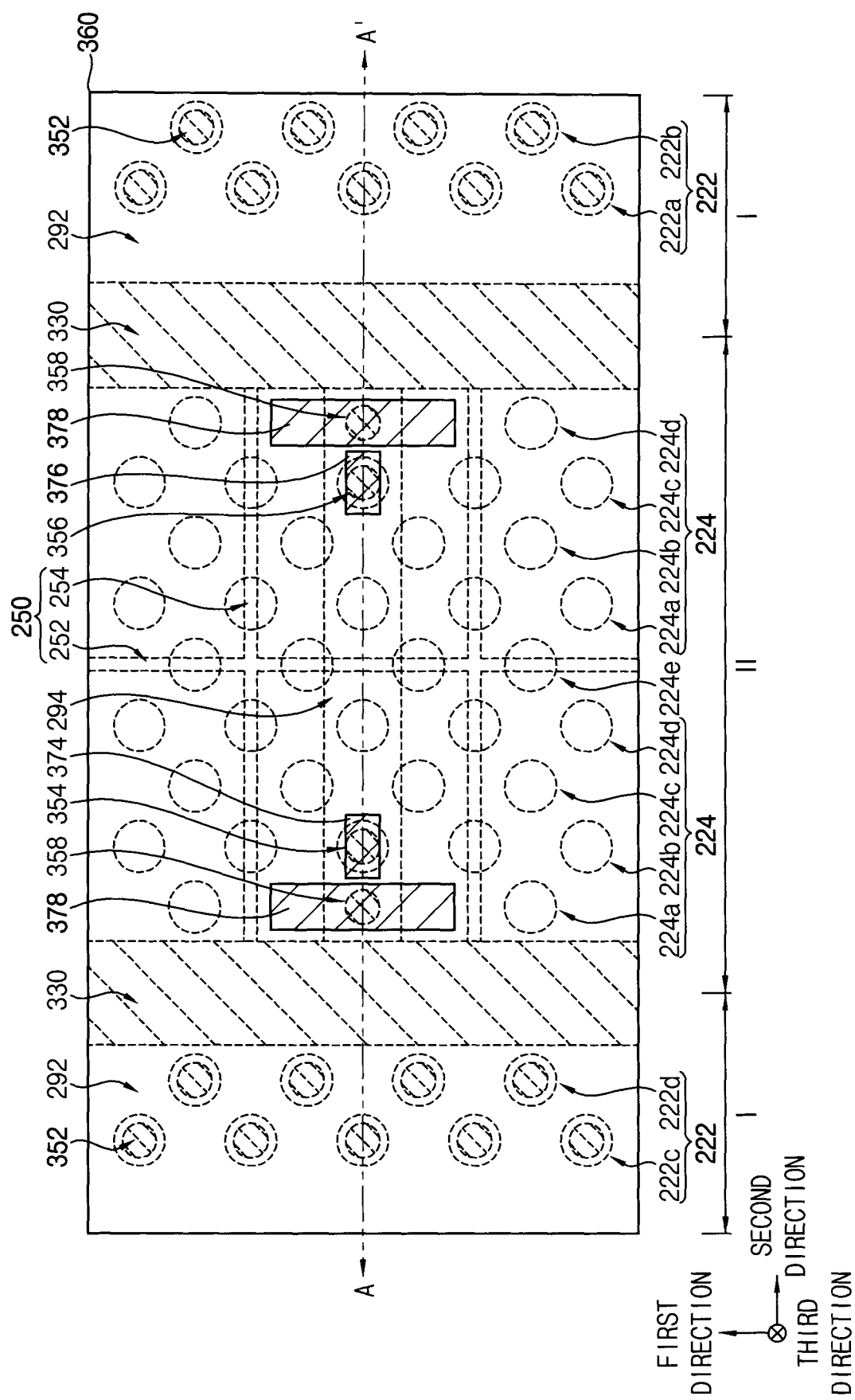

Referring to FIG. 22, unlike that of FIG. 18, the first division pattern 252 may extend lengthwise in the first direction to divide the space between a pair of second division patterns 254 into first and second spaces, and the gate electrode and the source electrode may be formed in the first space and the gate electrode and the drain electrode may be formed in the second space. The first space may be a space on one side (e.g., a left side) of the first division pattern 252 in the second direction, and the second space may be a space on the other side (e.g., a right side) of the division pattern 252 in the second direction.

Thus, in the first space, the fourth contact plug 358 and the fourth wiring 378 may be formed on a portion of the first conductive line 318, and the second contact plug 354 and the second wiring 374 may be formed on the second pad 244. Additionally, in the second space, the fourth contact plug 358 and the fourth wiring 378 may be formed on a portion of the conductive line 318, and the third contact plug 356 and the third wiring 376 may be formed on the second pad 244. The fourth semiconductor pattern 294 may extend lengthwise in the second direction to overlap the first and second spaces in the third direction.

Figure 23:
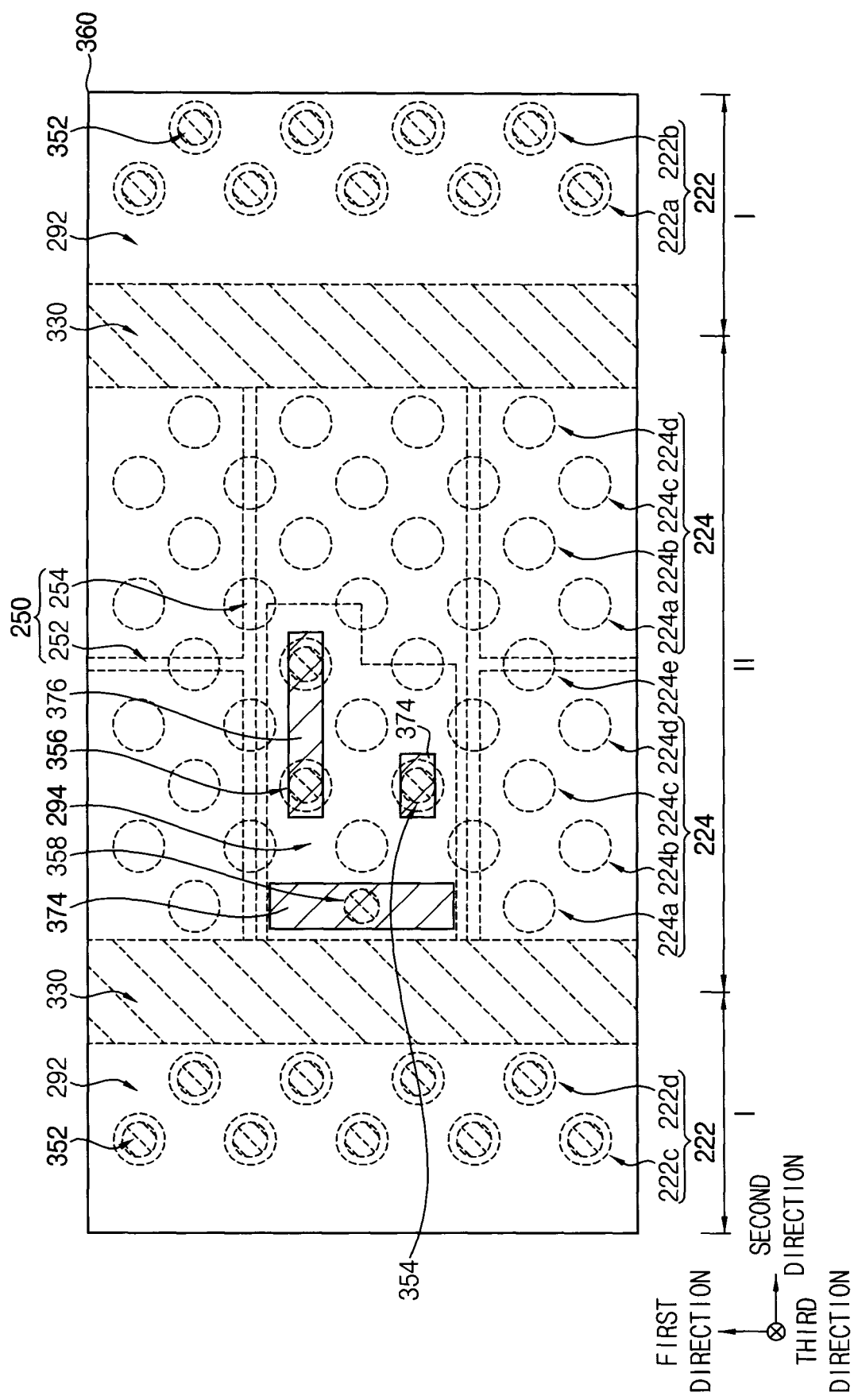

Referring to FIG. 23, unlike that of FIG. 18, the source electrode and the drain electrode may not be aligned with one another in the second direction but may be at least partially aligned in the first direction, and only one second contact plug 354 serving as the source electrode may be formed.

Figure 24:
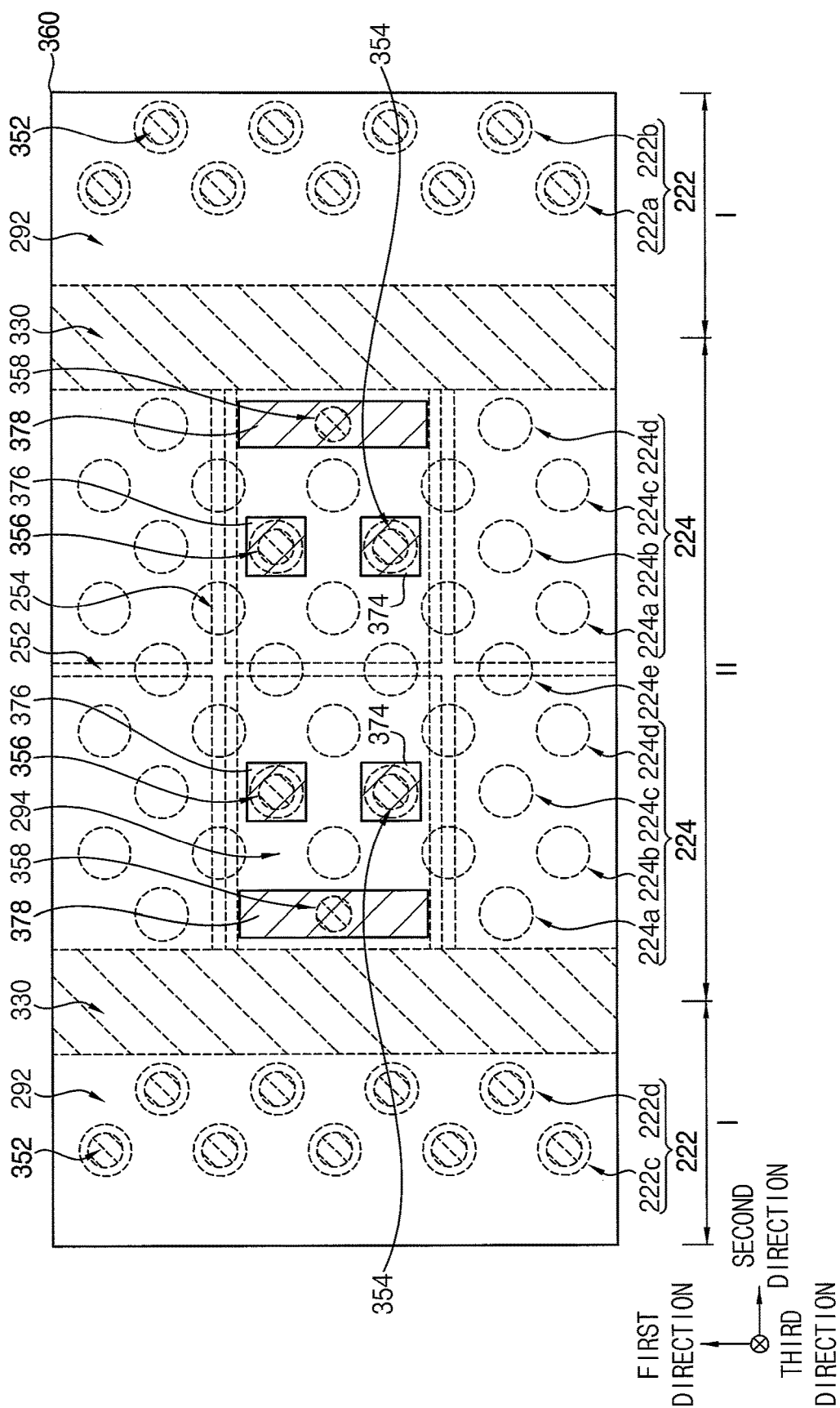

Referring to FIG. 24, unlike that of FIG. 18, the first division pattern 252 extends in the first direction to divide the space between a pair of second division patterns 254 into two, and a transistor may be formed in each of the divided two spaces.

One second contact plug 354 and one third contact plug 356 serving as the source electrode and the drain electrode, respectively, may be formed in each space, and may be aligned in the first direction.

Figure 25:
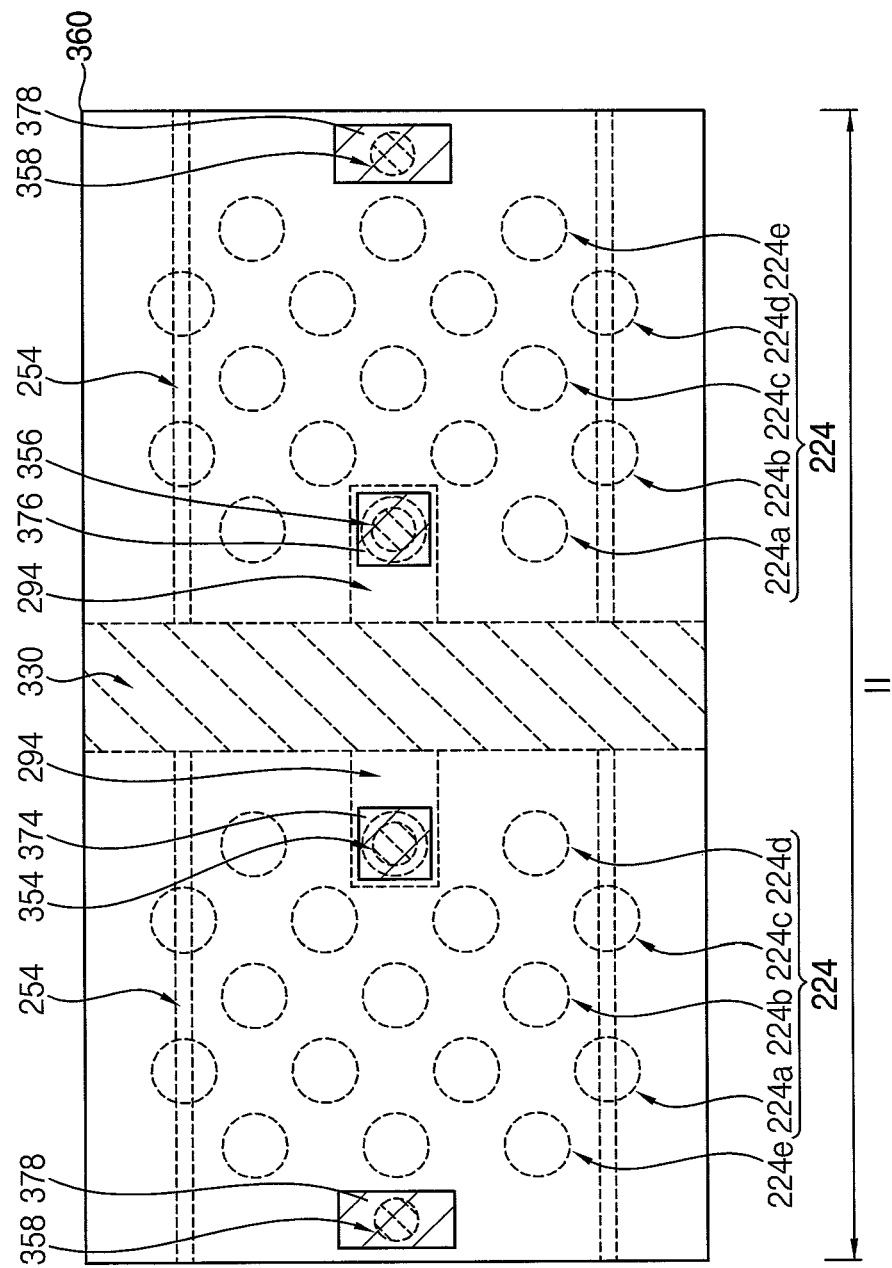

Referring to FIG. 25, unlike that of FIG. 18, the second region II of the substrate 100 may not be formed between the CSLs 330 that neighbor one another in the second direction, but may include spaces at both sides of a given CSL 330 in the second direction.

Thus, only a pair of second division patterns 254 may be formed with no first division pattern 252, and the fourth contact plug 358 and the fourth wiring 378 may be formed in each of first and second spaces formed by the pair of second division patterns 254 and the CSL 330. In addition, the second contact plug 354 serving as the source electrode and the second wiring 374 may be formed in the first space, and the third contact plug serving as the drain electrode and the third wiring 376 may be formed in the second space.

Figure 26:
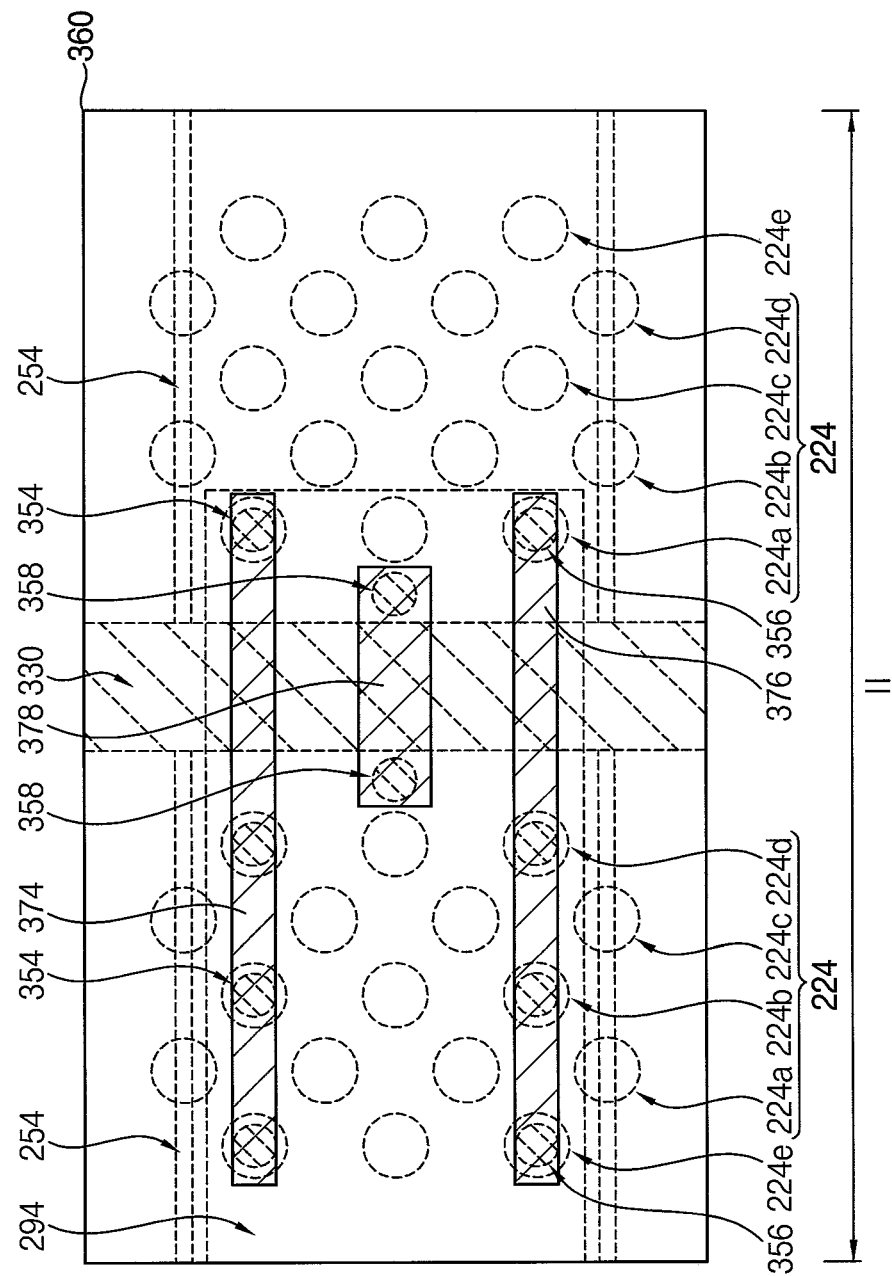

Referring to FIG. 26, like that of FIG. 25, the second region II of the substrate 100 may include spaces at both sides of a given CSL 330 in the second direction.

In example embodiments, ones of the second pads 244 on ones of the second channels 224 extending through the fourth semiconductor pattern 294 may be, e.g., polysilicon doped with p-type impurities, and ones of the second pads 244 on other ones of the second channels 224 and the first pads 242 on the first channels 222 on the first region I of the substrate 100 may include polysilicon doped with n-type impurities.

Thus, a transistor including the second channels 224 connected with each other via the fourth semiconductor pattern 294 may form a p-type transistor.

The second contact plugs 354 serving as the source electrode are aligned in the second direction, and the third contact plugs 356 serving as the drain electrode are aligned in the second direction. Thus, each of the second and third wirings 374 and 376 extends lengthwise in the second direction. The fourth contact plugs 358 are formed on portions of the first conductive line 318 at both sides of the CLS 330, and thus the fourth wiring 378 also extends lengthwise in the second direction.

Figure 27:
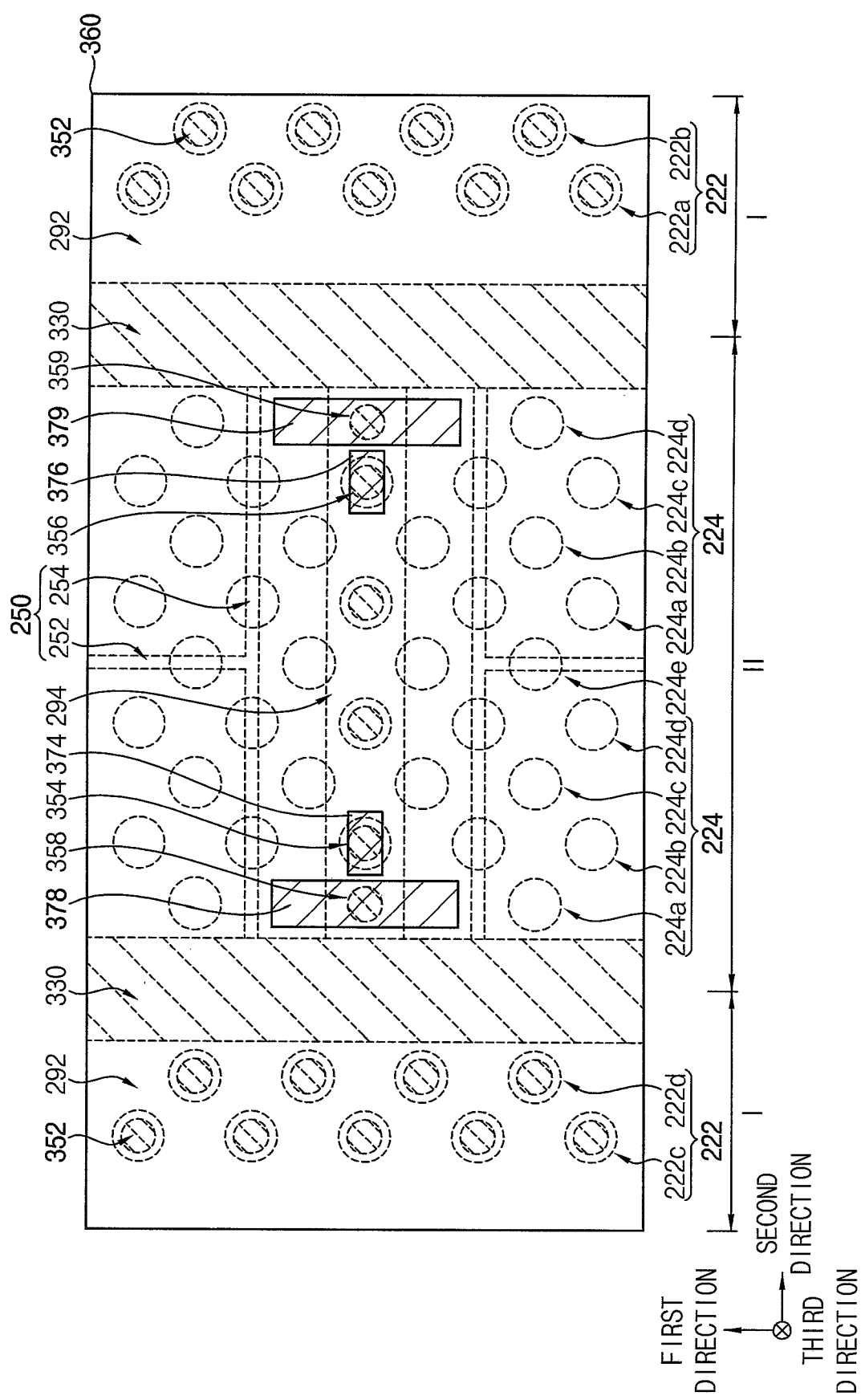
Figure 28:
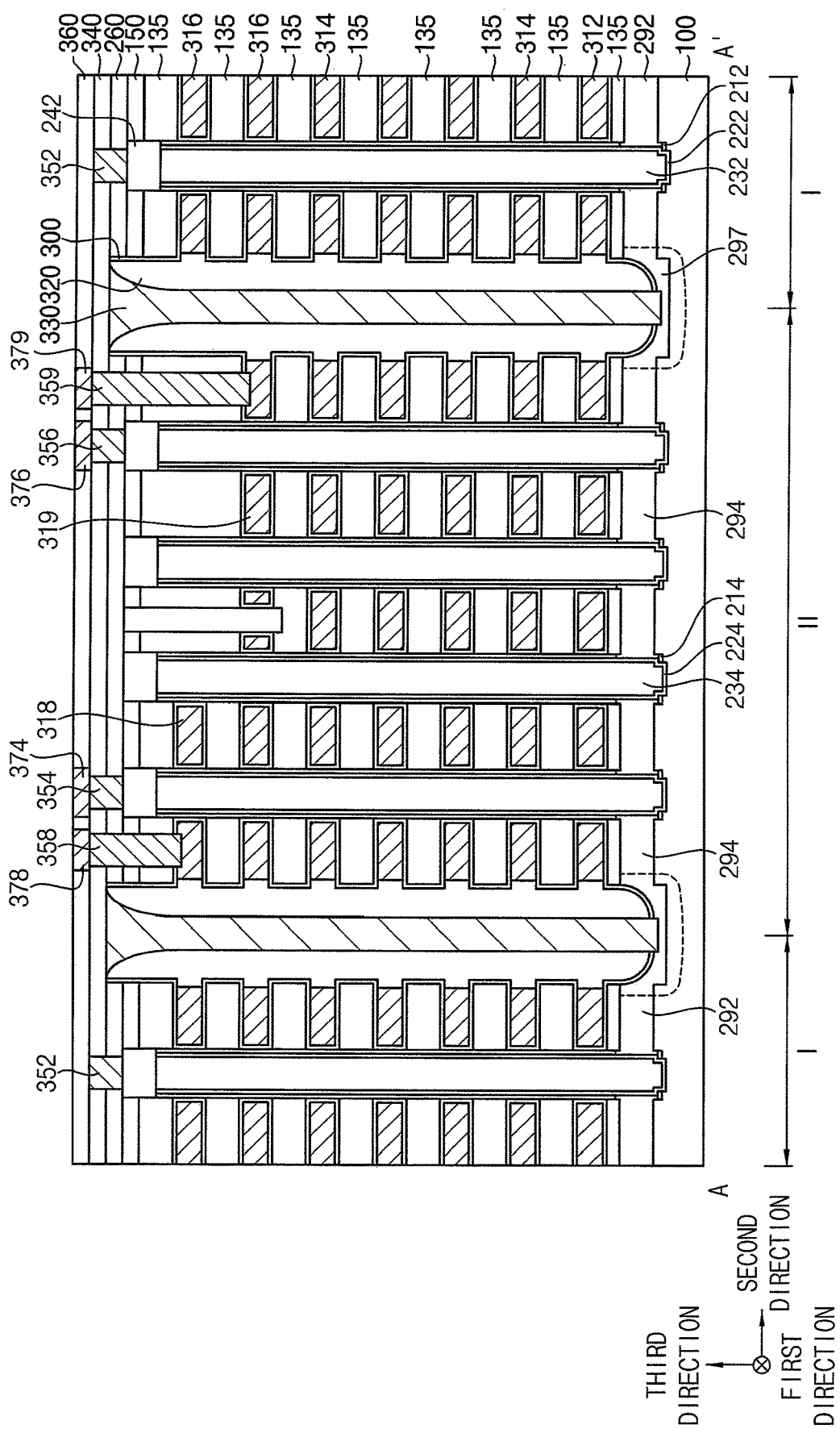

Referring to FIGS. 27 and 28, the first conductive line 318 at the uppermost level among the conductive lines is connected to the fourth contact plug 358 and the fourth wiring 378 applying a gate voltage, and a second conductive line 319 at a second level from above among the conductive lines are connected to the fifth contact plug 359 and the fifth wiring 379 applying a gate voltage.

Thus, a transistor on the second region II of the substrate 100 may not necessarily be implemented using one of the conductive lines at an uppermost level, and when a portion of one of the conductive lines at another level is not overlapped with upper ones of the conductive lines, the transistor may be implemented using the one of the conductive lines at another level.

Figure 29:
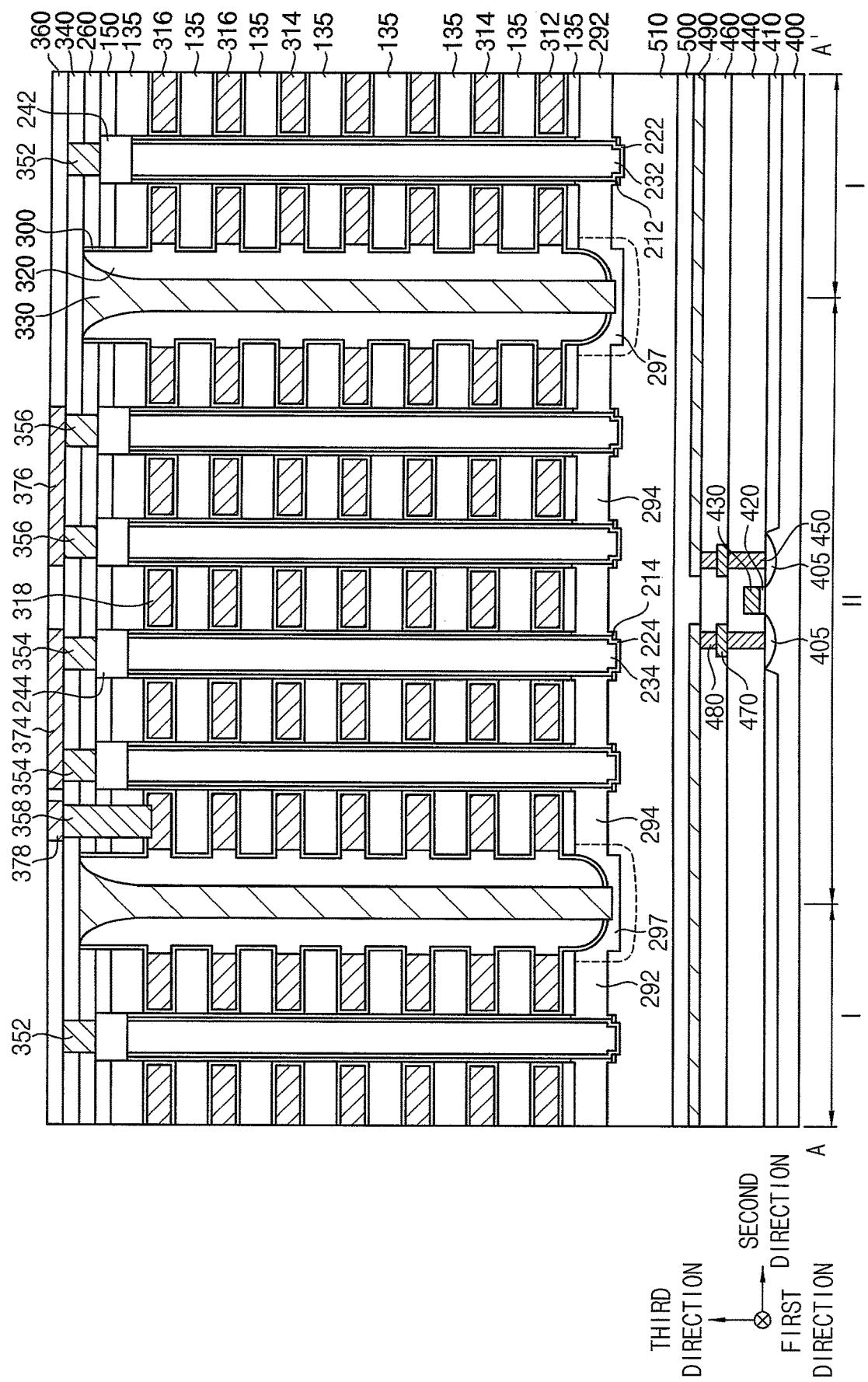
FIG. 29 is a cross-sectional view illustrating a vertical memory device in accordance with example embodiments.

FIG. 29 is a cross-sectional view illustrating a vertical memory device in accordance with example embodiments.

The vertical memory device of FIG. 29 may include elements the same as or similar to that of FIGS. 18, 19A, and 19B. Thus, like reference numerals refer to like elements, and detailed descriptions thereon are omitted herein.

Referring to FIG. 29, the vertical memory device may have a cell over pen (COP) structure.

For example, a circuit pattern region and a cell array region may be vertically stacked on a substrate 400. However, as illustrated with reference to FIGS. 18, 19A, and 19B, the circuit region II including circuit patterns for driving the memory cells may be further formed in the cell region I.

The substrate 400 may include a field region having an isolation pattern 410 thereon and an active region.

The circuit patterns may include transistors, lower contact plugs, lower wirings, lower vias, etc. In an example embodiment, a lower transistor including a lower gate structure having a lower gate insulation pattern 420 and a lower gate electrode 430 sequentially stacked on the substrate 400 and a second impurity region 405 at an upper portion of the active region of the substrate 400 adjacent to the lower gate structure may be formed.

The first lower insulating interlayer 440 may be formed on the substrate 400 to cover the lower transistor, and a lower contact plug 450 may extend through the first lower insulating interlayer 440 to contact the second impurity region 405.

A first lower wiring 470 may be formed on the first lower insulating interlayer 440 to contact an upper surface of the lower contact plug 450. A lower via 480 and a second lower wiring 490 may be sequentially stacked on the first lower wiring 470.

A second lower insulating interlayer 460 may be formed on the first lower insulating interlayer 440 to cover the first lower wiring 470 and the lower via 480. A third lower insulating interlayer 500 may be formed on the second lower insulating interlayer 460 to cover the second lower wiring 490.

A base pattern 510 may be formed on the third lower insulating interlayer 500, and the structures shown in FIGS. 19A and 19B may be formed on the base pattern 510. The base pattern 510 may be formed of a semiconductor material, e.g., polysilicon.

In example embodiments, transistors that may be formed using the structures on the first region I of the substrate 400 may be formed on the second region II of the substrate 400, and thus an area of the circuit patterns in the circuit region under the cell array region may be reduced. For example, even if an area of the memory cells in the cell array region may be reduced by increasing the levels at which the conductive lines are formed, if the area of the circuit patterns in the circuit region under the cell array region is not reduced, the whole area of the vertical memory device may not be reduced. However, in example embodiments, some of the structures included in the memory cells in the cell array region may serve as elements of the circuit patterns, so that the area of the circuit region may be reduced, and thus the integration degree of the vertical memory device may be enhanced.

Figure 30:
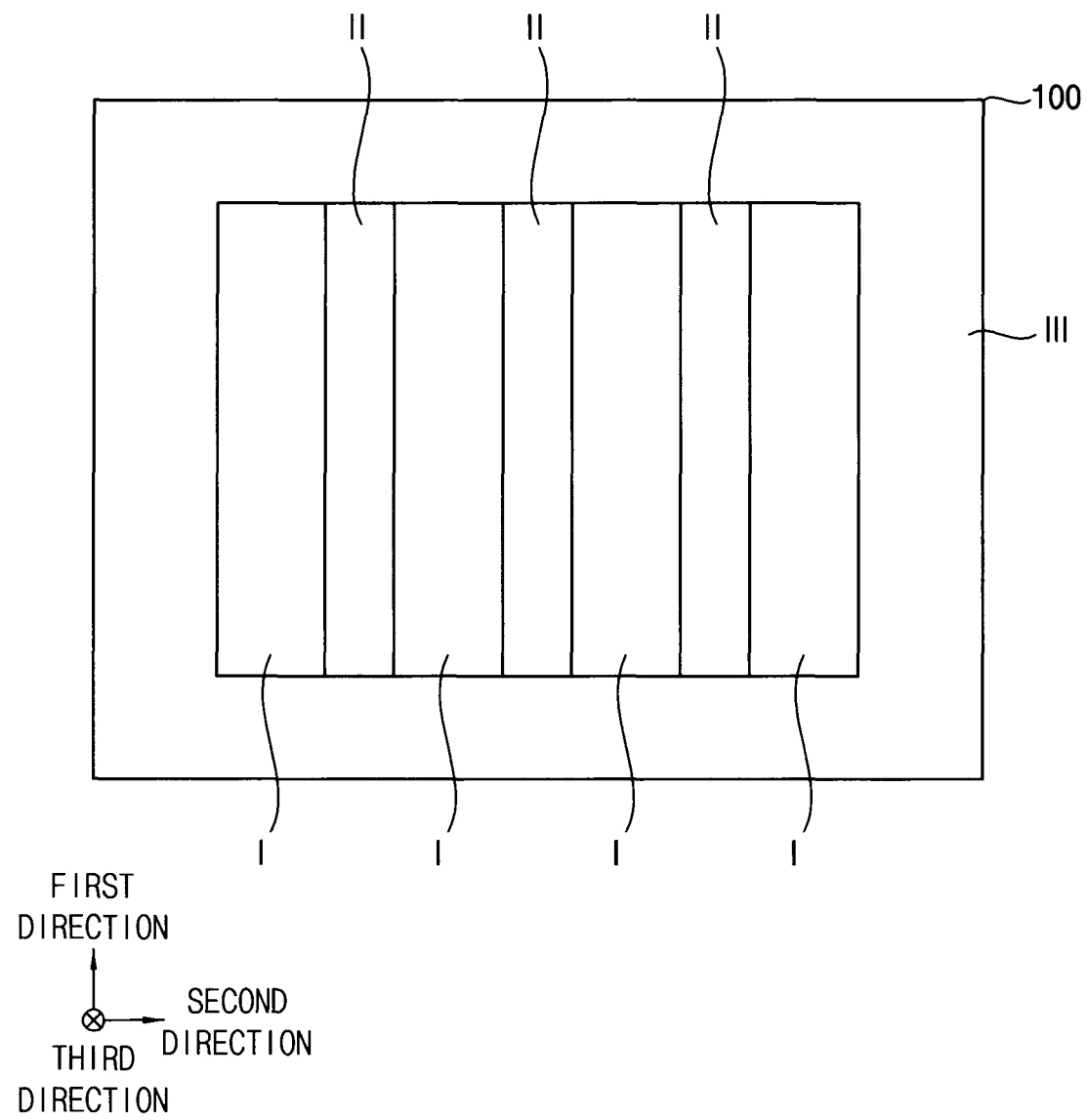
FIGS. 30 and 31 are plan views illustrating the layouts of the first to third regions of the substrate on which the vertical memory device may be formed.
Figure 31:
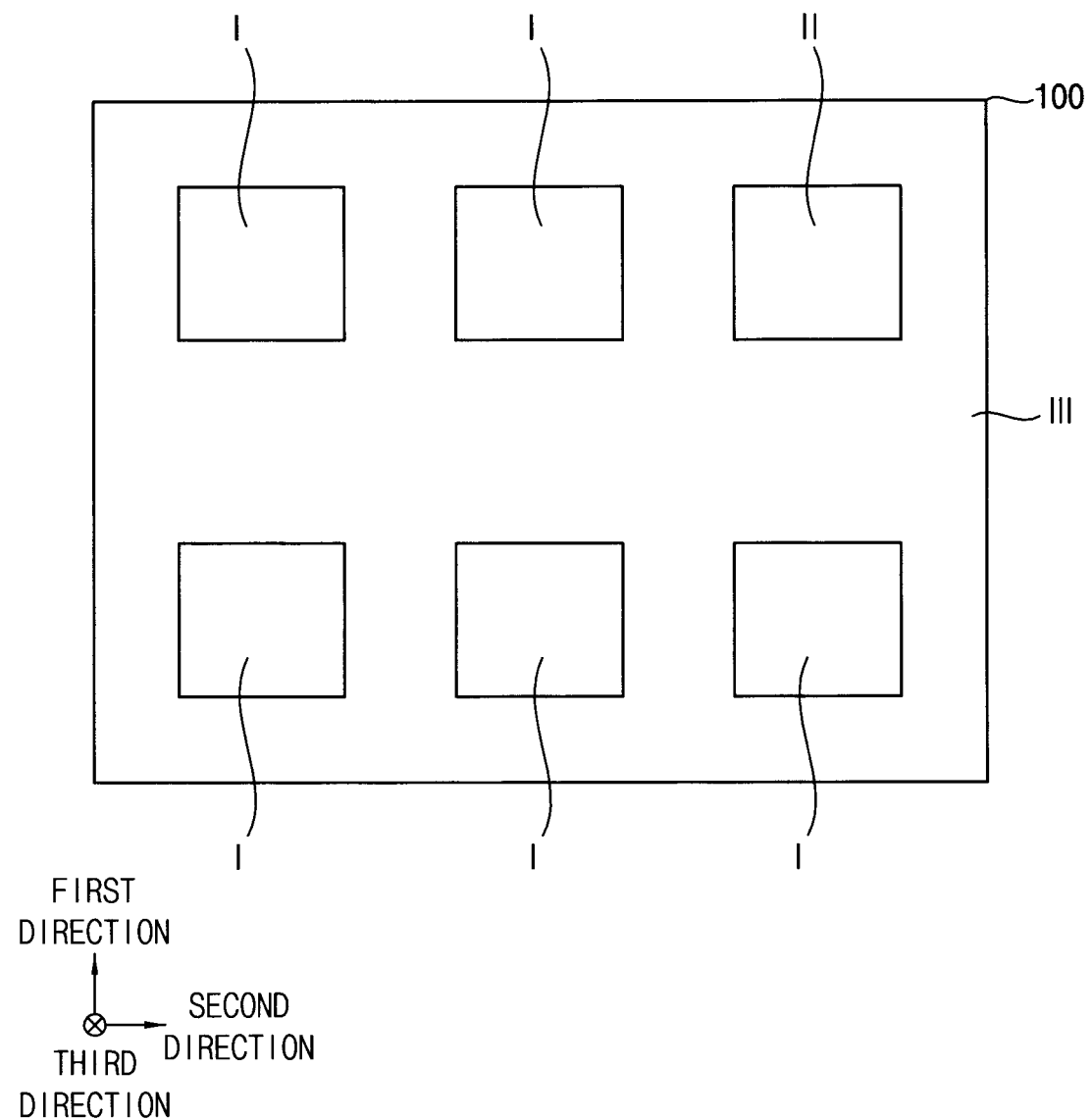

FIGS. 30 and 31 are plan views illustrating the layouts of the first to third regions of the substrate on which the vertical memory device may be formed.

Referring to FIG. 30, unlike that of FIG. 1, a plurality of second regions II of the substrate 100 may be formed in the second direction in the first region I of the substrate 100.

Referring to FIG. 31, when a plurality of first regions I of the substrate 100 is formed in each of the first and second directions and the third region III surrounding the first region I is formed, an entire portion of at least one of the plurality of first regions I may be converted into the second region II.

The layouts of the first to third regions I, II, and III of the substrate 100 shown in FIGS. 30 and 31 may be applied to the substrate 400 in the vertical memory device having a COP structure.

Figure 33:
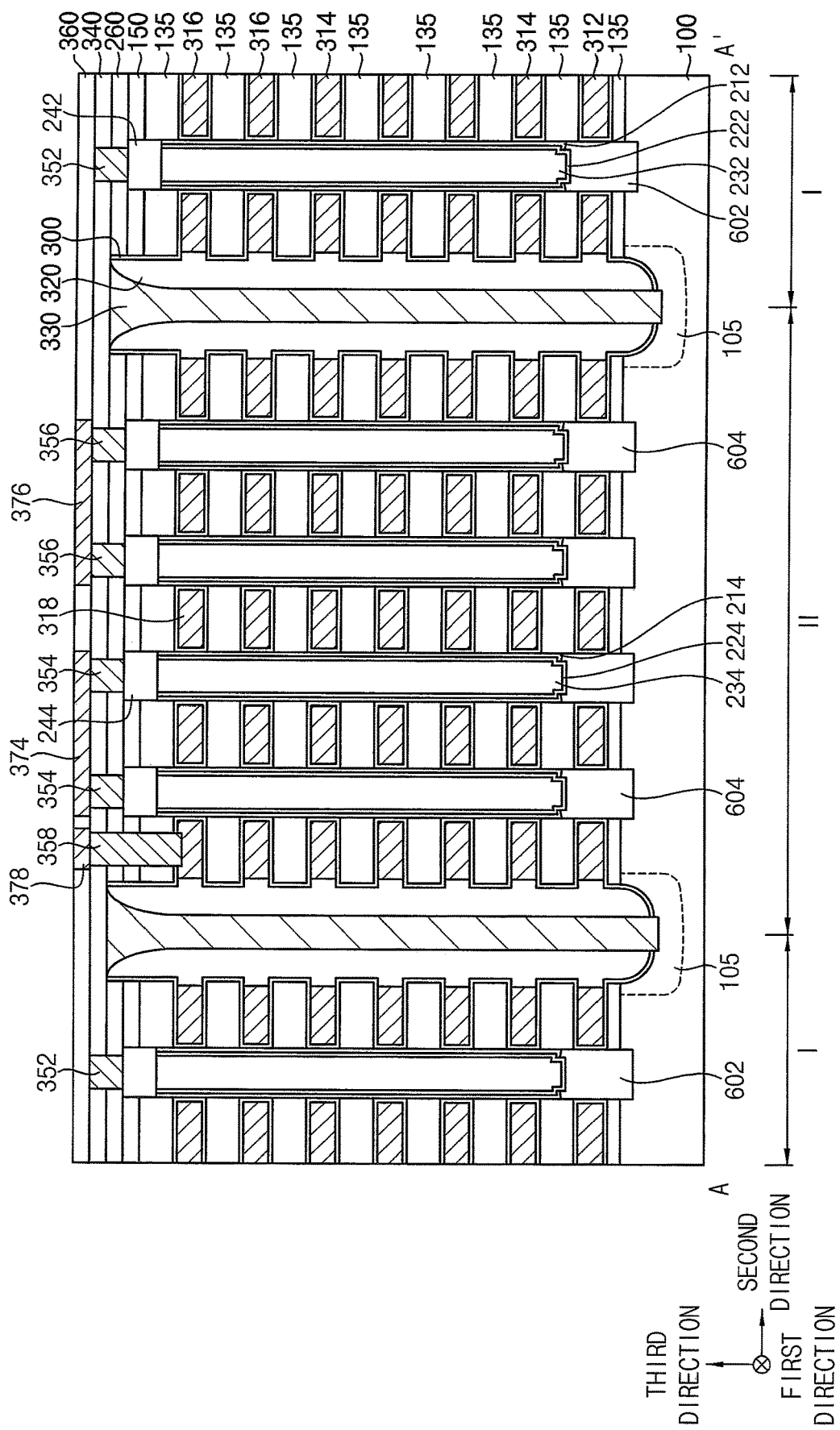
Figure 34A:
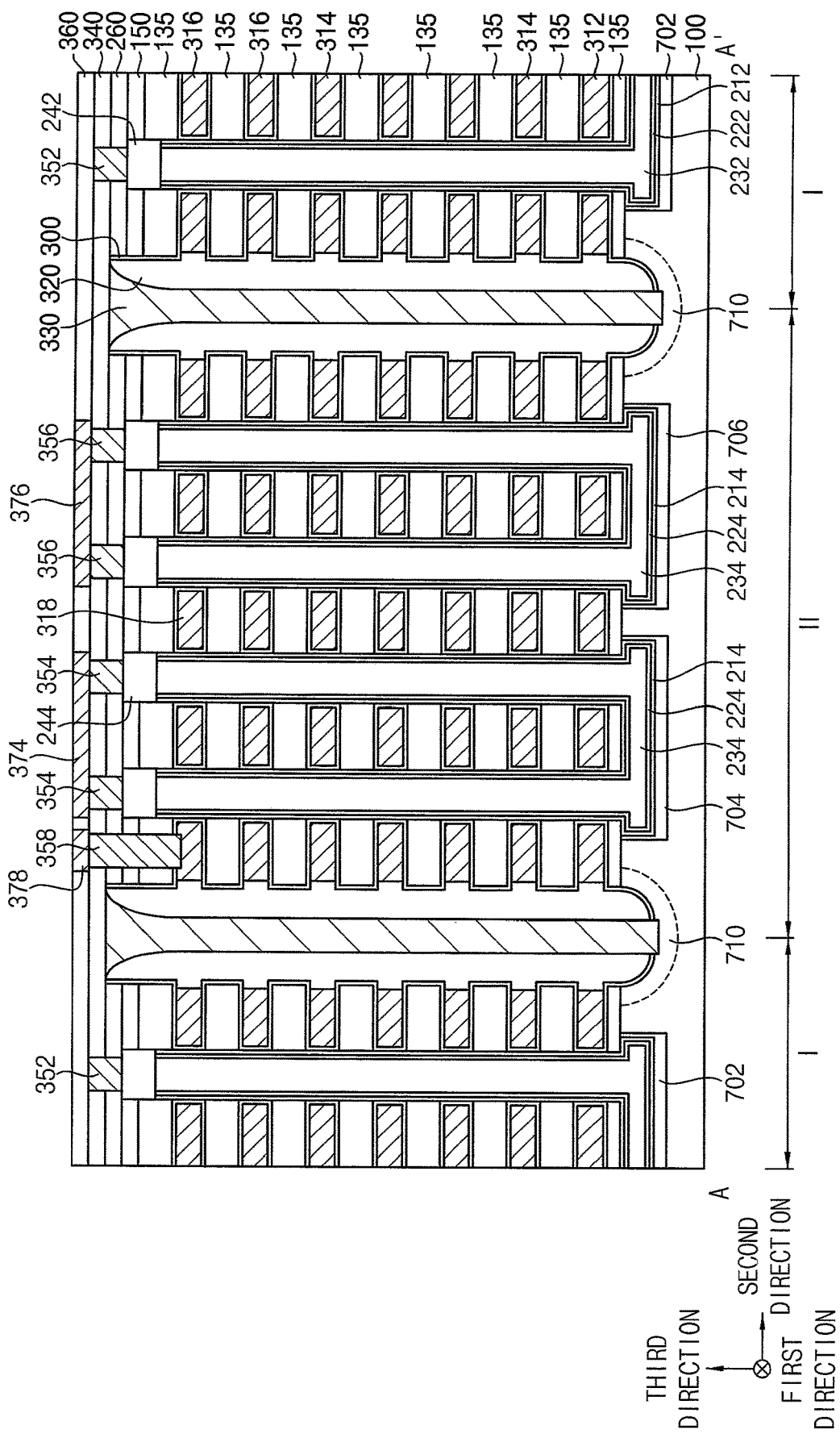
Figure 34B:
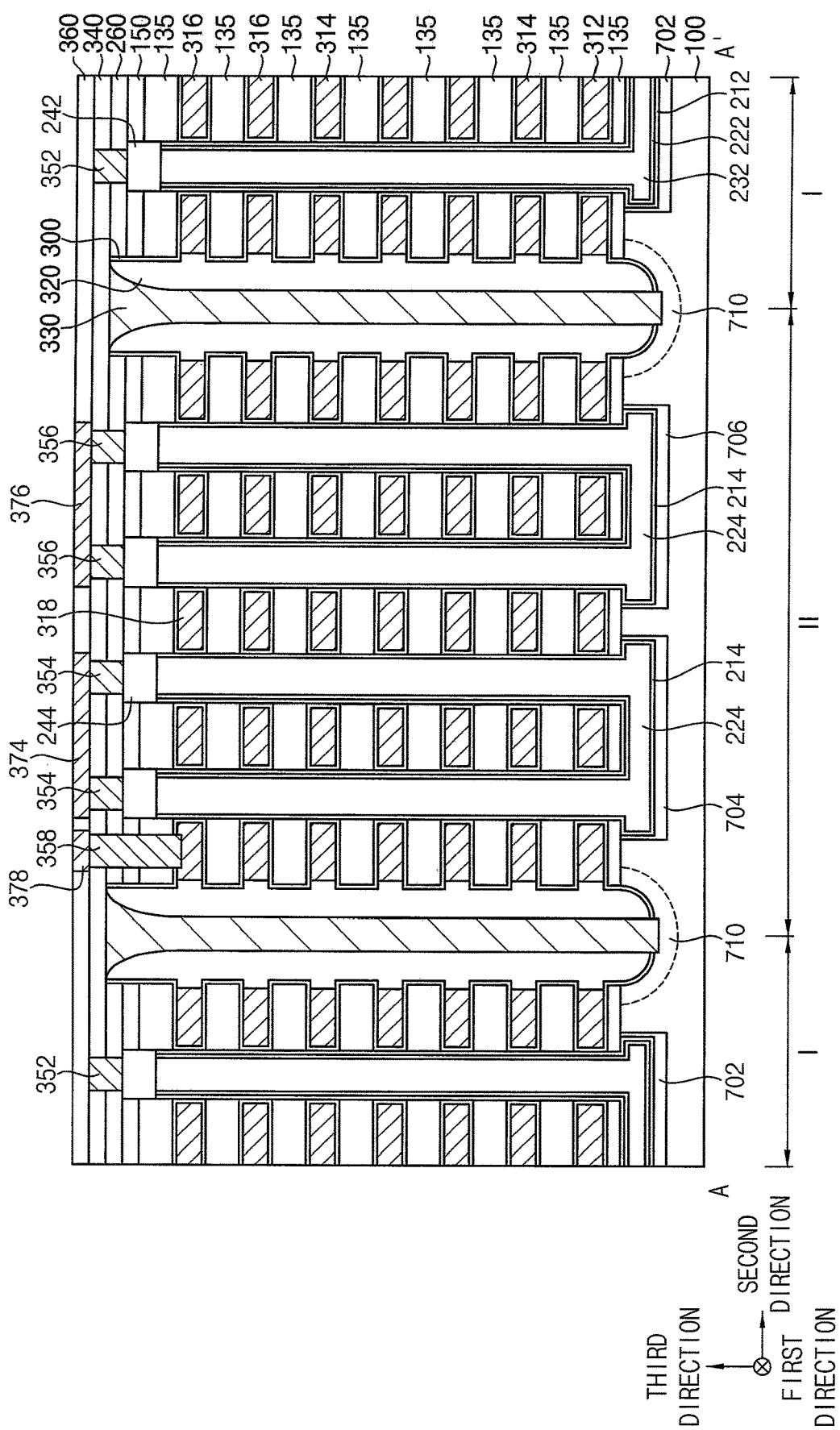
Figure 34C:
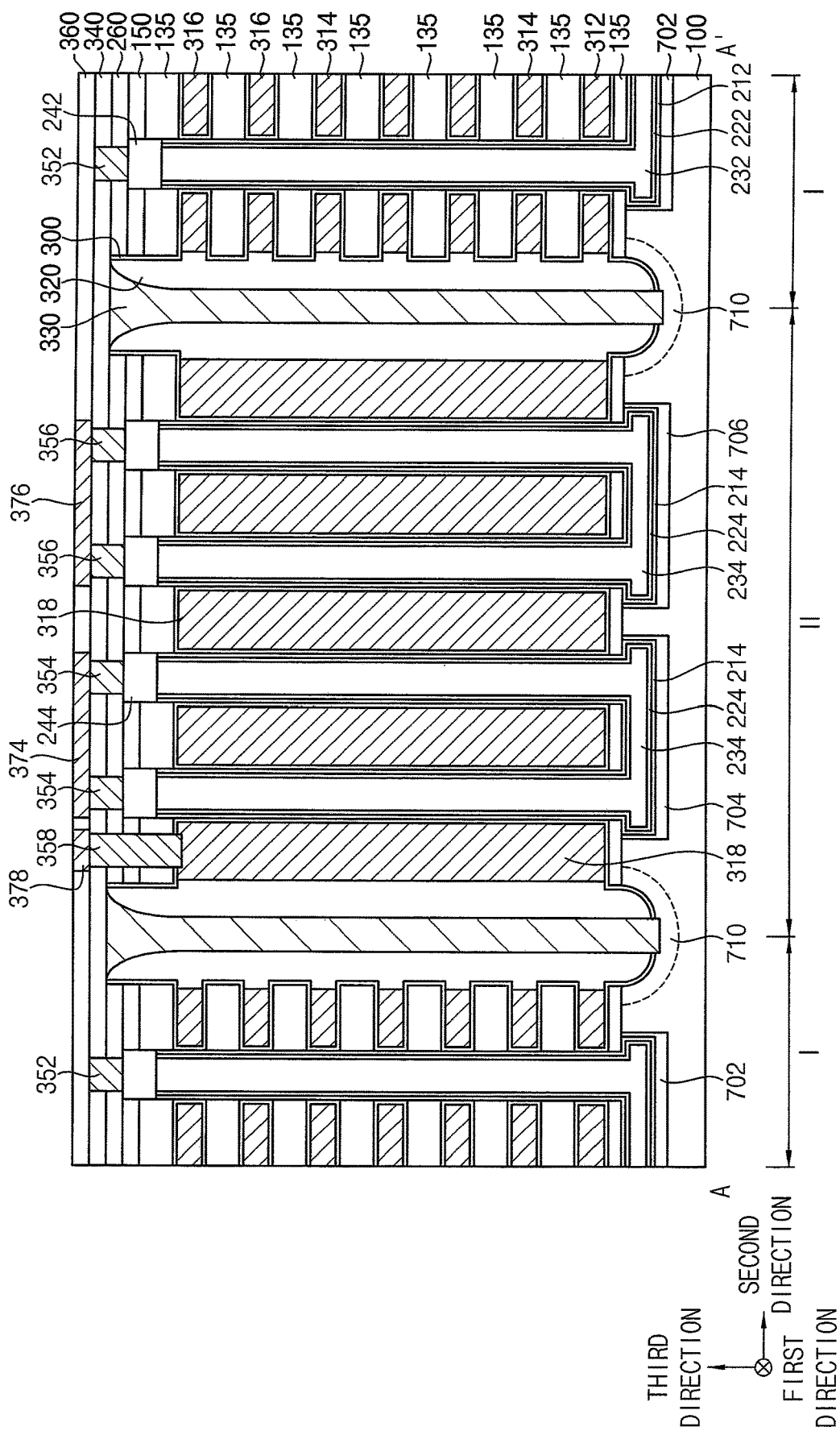
Figure 35:
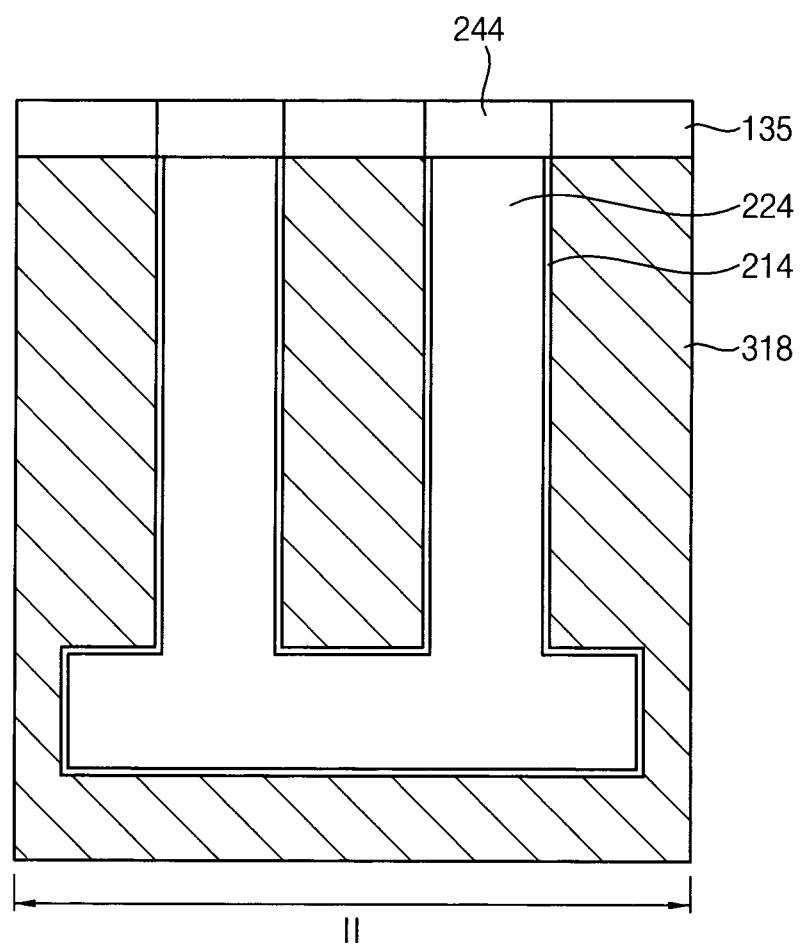

FIGS. 32, 33, 34A, 34B, 34C, and 35 are cross-sectional views illustrating vertical memory devices in accordance with example embodiments. FIG. 35 shows the channel and the conductive line structure on the second region II of the substrate 100 only.

The vertical memory devices may be the same as or similar to that of FIGS. 18, 19A and 19B, except for the fourth semiconductor pattern or the first and second channels. Thus, like reference numerals refer to like elements, and detailed descriptions thereon are omitted herein.

Figure 32:
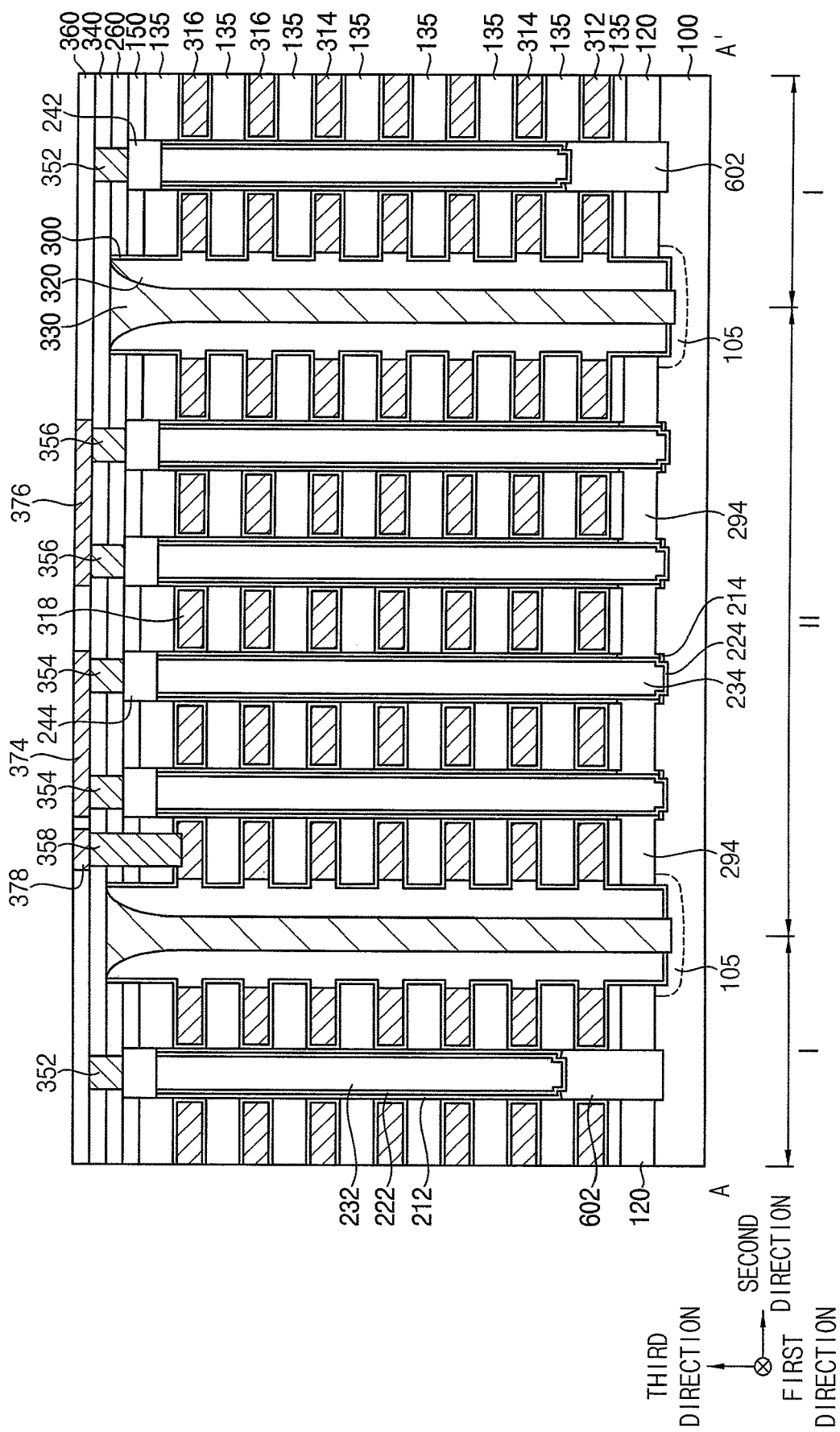
FIGS. 32, 33, 34A, 34B, 34C, and 35 are cross-sectional views illustrating vertical memory devices in accordance with example embodiments.

Referring to FIG. 32, unlike that of the second region II of the substrate 100, no third semiconductor pattern 292 may be formed on the first region I of the substrate 100, which may be implemented by forming the first sacrificial layer 110 to include only the second portion 114 of the second region II of the substrate 100 during the processes illustrated with reference to FIGS. 2 and 3.

However, a fifth semiconductor pattern 602 including, e.g., single crystalline silicon may be formed between each of the first channels 222 on the first region I of the substrate 100 and the upper surface of the substrate 100. Thus, the first channels 222 may be connected to the substrate 100 by the fifth semiconductor pattern 602. The fifth semiconductor pattern 602 may be formed by a selective epitaxial growth (SEG) process using the upper surface of the first region I of the substrate 100 exposed by the opening 270.

A third impurity region 105 doped with, e.g., n-type impurities may be formed at an upper portion of the substrate 100 contacting the CSL 330.

Referring to FIG. 33, like the vertical memory device of FIG. 32, no third semiconductor pattern 292 may be formed, and further no fourth semiconductor pattern 294 may be formed.

Thus, a sixth semiconductor pattern 604 may be formed under each of the second channels 224 on the second region II of the substrate 100 as the fifth semiconductor pattern 602 under each of the first channels 222 on the first region I of the substrate 100, and the second channels 224 may be connected with each other by the sixth semiconductor patterns 604 and the substrate 100.

Referring to FIG. 34A, neighboring first channels 222 may be connected with each other to have a pipe-like shape, and neighboring second channels 224 may be also connected with each other to have a pipe-like shape.

A first gate electrode 702 at an upper portion of the substrate 100 may partially cover the connected first channels 222, a second gate electrode 704 at an upper portion of the substrate 100 may partially cover the connected second channels 224 under the second contact plugs 354, and a third gate electrode 706 at an upper portion of the substrate 100 may partially cover the connected second channels 224 under the third contact plugs 356.

A fourth impurity region 710 may be formed at an upper portion of the substrate 100 contacting the CSL 330.

Referring to FIG. 34B, unlike each of the first channels 222 having a hollow pipe-like shape on the first region I of the substrate 100, each of the second channels 224 on the second region II of the substrate 100 may have a solid pipe-like shape, and thus no second filling pattern 234 may be formed.

Referring to FIG. 34C, the conductive line structure on the first region I of the substrate 100 may include a plurality of conductive lines spaced apart from each other in the third direction, which may include the GSL 312, the word line 314, and the SSL 316. The conductive line structure on the second region II of the substrate 100 may include a single structure extending in the third direction, e.g., one first conductive line 318.

Referring to FIG. 35, the neighboring second channels 224 may be connected with each other to have a solid pipe-like shape, and thus no second filling pattern 234 may be formed. The conductive line structure surrounding the second channels 224 may include a single structure extending in the third direction, e.g., one first conductive line 318.

The second channel 224 having a pipe-like shape may be formed between the second pads 244 serving as source and drain, respectively, on the second region II of the substrate 100, and the second channel 224 may be surrounded by the first conductive line 318 extending in the third direction.

While example embodiments have been particularly shown and described, it will be understood by one of ordinary skill in the art that variations in form and detail may be made therein without departing from the spirit and scope of the claims.

What is claimed is:

1. A vertical memory device, comprising:
   conductive lines stacked on a substrate, the conductive lines being spaced apart from each other in a vertical direction perpendicular to an upper surface of the substrate, and each of the conductive lines extending lengthwise in a first direction parallel to the upper surface of the substrate;
   first and second semiconductor patterns extending through the conductive lines in the vertical direction;
   first and second pads on the first and second semiconductor patterns, respectively;
   first and second electrodes electrically connected to the first and second pads, respectively;
   a third electrode electrically connected to a first conductive line of the conductive lines; and
   a first division pattern extending lengthwise in a second direction parallel to the upper surface of the substrate and crossing the first direction, the first division pattern extending through and dividing the first conductive line,
   wherein in a plan view, the first and second semiconductor patterns and the first conductive line are disposed at one side of the first division pattern.

2. The vertical memory device of claim 1, wherein the first conductive line is disposed at an uppermost level among levels at which the conductive lines are respectively disposed.

3. The vertical memory device of claim 1, wherein the first conductive line is disposed at a second level from above among levels at which the conductive lines are respectively disposed.

4. The vertical memory device of claim 1, wherein the first division pattern extends lengthwise through ones of the conductive lines at an uppermost level and a second level from above.

5. The vertical memory device of claim 1,
wherein a plurality of first division patterns is disposed in the first direction, each of the plurality of first division patterns dividing the first conductive line, and
wherein a plurality of first semiconductor patterns, a plurality of second semiconductor patterns, a plurality of first electrodes, a plurality of second electrodes, and a plurality of third electrodes are formed in the first direction.

6. The vertical memory device of claim 1, further comprising:
a second division pattern connected to the first division pattern, the second division pattern extending in the first direction to penetrate through and divide the first conductive line.

7. The vertical memory device of claim 6,
wherein the first division pattern includes a pair of first division patterns spaced apart from each other in the first direction, and
wherein the first and second semiconductor patterns and the first conductive line are formed in a space between the pair of first division patterns.

8. The vertical memory device of claim 7, wherein the second division pattern crosses the pair of first division patterns to divide the space between the pair of first division patterns into two spaces.

9. The vertical memory device of claim 8, wherein in a plan view, the first and second semiconductor patterns and the first to third electrodes are disposed in one of the two spaces formed by the pair of first division patterns and the second division pattern.

10. The vertical memory device of claim 8, wherein in a plan view, the first and second semiconductor patterns and the first to third electrodes are disposed in each of the two spaces formed by the pair of first division patterns and the second division pattern.

11. The vertical memory device of claim 1, further comprising:
a third semiconductor pattern commonly contacting lower surfaces of the first and second semiconductor patterns to connect the first and second semiconductor patterns with each other.

12. The vertical memory device of claim 11,
wherein the first division pattern includes a pair of first division patterns spaced apart from each other in the first direction, and
wherein in a plan view, the third semiconductor pattern is disposed between the pair of first division patterns.

13. The vertical memory device of claim 1, further comprising:
circuit patterns on the substrate;
an insulating interlayer covering the circuit patterns;
a base pattern on the insulating interlayer; and
a third semiconductor pattern commonly contacting lower surfaces of the first and second semiconductor patterns to connect the first and second semiconductor patterns with each other,
wherein the conductive lines are stacked on the base pattern, and
wherein the first to third semiconductor patterns, the first and second pads, and the first conductive line form a transistor.

14. The vertical memory device of claim 1, wherein a source voltage is applied to the first electrode, a drain voltage is applied to the second electrode, and a gate voltage is applied to the third electrode.

15. A vertical memory device, comprising:
conductive lines stacked on a substrate, the conductive lines being spaced apart from each other in a vertical direction perpendicular to an upper surface of the substrate, and each of the conductive lines extending lengthwise in a first direction parallel to the upper surface of the substrate;
semiconductor patterns extending through the conductive lines in the vertical direction;
conductive pads on the semiconductor patterns, respectively;
source and drain electrodes electrically connected to first and second pads, respectively, of the conductive pads;
a gate electrode electrically connected to a first conductive line of the conductive lines; and
a pair of first division patterns, each of the pair of first division patterns extending lengthwise in a second direction and dividing the first conductive line, the second direction being parallel to the upper surface of the substrate and crossing the first direction,
wherein first and second semiconductor patterns under the first and second pads, respectively, among the semiconductor patterns are connected with each other, and
wherein in a plan view, the first and second pads, the first and second semiconductor patterns, and the first conductive line are disposed between the pair of first division patterns to form a transistor.

16. The vertical memory device of claim 15, wherein the first conductive line is disposed at an uppermost level among levels at which the conductive lines are respectively disposed.

17. The vertical memory device of claim 15, wherein the first and second semiconductor patterns are connected with each other by a third semiconductor pattern commonly contacting lower surfaces of the first and second semiconductor patterns on the substrate.

18. The vertical memory device of claim 17, wherein in a plan view, the third semiconductor pattern is disposed between the pair of first division patterns.

19. A vertical memory device, comprising:
conductive lines stacked on a substrate in a vertical direction perpendicular to an upper surface of the substrate, the substrate including first and second regions;
channels extending through the conductive lines in the vertical direction;
conductive pads on the channels, respectively, the conductive pads including first pads on the first region of the substrate and second and third pads on the second region of the substrate;
a first wiring for applying a first signal to the first pads on the first region of the substrate;
second and third wirings for applying second and third signals to the second and third pads, respectively, on the second region of the substrate, the second and third wirings being different from the first wiring; and
a fourth wiring for applying a fourth signal to a portion of one conductive line among the conductive lines on the second region of the substrate,
wherein the second and third pads, the channels under the second and third pads, respectively, and the portion of one conductive line form a transistor.

20. The vertical memory device of claim 19, further comprising:
circuit patterns on the substrate;
an insulating interlayer covering the circuit patterns; and
a base pattern on the insulating interlayer,
wherein the conductive lines are stacked on the base pattern.

\* \* \* \* \*